(12) United States Patent
Ha et al.

(10) Patent No.: US 11,353,631 B2
(45) Date of Patent: Jun. 7, 2022

(54) DISPLAY DEVICE AND METHOD OF MANUFACTURING THE SAME

(71) Applicant: Samsung Display Co., Ltd., Yongin-si (KR)

(72) Inventors: Ju Hwa Ha, Seoul (KR); Jae Joong Kwon, Suwon-si (KR); Beom Shik Kim, Yongin-si (KR); Joo Woan Cho, Seongnam-si (KR); Su Jung Huh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/552,092

(22) Filed: Aug. 27, 2019

(65) Prior Publication Data

US 2020/0096676 A1    Mar. 26, 2020

(30) Foreign Application Priority Data

Sep. 21, 2018   (KR) ................. 10-2018-0114435

(51) Int. Cl.
| | | |
|---|---|---|
| *H01L 27/15* | (2006.01) | |
| *G02B 3/00* | (2006.01) | |
| *G03F 7/20* | (2006.01) | |
| *H01L 27/32* | (2006.01) | |
| *H01L 51/52* | (2006.01) | |
| *G06F 1/16* | (2006.01) | |

(52) U.S. Cl.
CPC .......... *G02B 3/0037* (2013.01); *G02B 3/0012* (2013.01); *G03F 7/70058* (2013.01); *H01L 27/322* (2013.01); *H01L 51/5275* (2013.01); *G06F 1/163* (2013.01)

(58) Field of Classification Search
CPC ................. G02B 27/0172; H01L 27/156
See application file for complete search history.

(56) References Cited

U.S. PATENT DOCUMENTS

| | | | |
|---|---|---|---|
| 6,972,744 B1 * | 12/2005 | Allio | H04N 13/305 |
| | | | 345/88 |
| 8,705,177 B1 | 4/2014 | Miao | |
| 2008/0049152 A1 | 2/2008 | Hong et al. | |
| 2012/0154920 A1 | 6/2012 | Harrison et al. | |
| 2013/0234935 A1 | 9/2013 | Griffith | |
| 2014/0168783 A1 | 6/2014 | Luebke et al. | |

(Continued)

FOREIGN PATENT DOCUMENTS

| | | |
|---|---|---|
| JP | 2015-230383 A | 12/2015 |
| KR | 10-2006-0047160 A | 5/2006 |

(Continued)

OTHER PUBLICATIONS

EPO Partial Search Report dated Feb. 4, 2020, for corresponding European Patent Application No. 19198000.2 (14 pages).

*Primary Examiner* — Christopher A Johnson
(74) *Attorney, Agent, or Firm* — Lewis Roca Rothgerber Christie LLP

(57) ABSTRACT

A display device and a method of manufacturing the same are provided. The display device includes a display panel including a series of pixels, each pixel including N sub-pixels, where N is an integer of 2 or greater; and a lens array on a surface of the display panel, the lens array including a series of lenses, wherein each of the lenses overlaps with M sub-pixels, where M is an integer greater than N.

20 Claims, 23 Drawing Sheets

(56) References Cited

U.S. PATENT DOCUMENTS

| | | |
|---|---|---|
| 2016/0238748 A1 | 8/2016 | Lee et al. |
| 2017/0109562 A1 | 4/2017 | Shroff et al. |
| 2017/0171533 A1 | 6/2017 | Benitez et al. |
| 2017/0264891 A1 | 9/2017 | Iwasaki |
| 2017/0315372 A1 | 11/2017 | Bang et al. |
| 2018/0115771 A1* | 4/2018 | Kwon ................ G09G 3/2003 |
| 2019/0215474 A1* | 7/2019 | Nojima ................ H04N 5/374 |

FOREIGN PATENT DOCUMENTS

| | | |
|---|---|---|
| KR | 10-2006-0059810 A | 6/2006 |
| KR | 10-2014-0018209 A | 2/2014 |
| KR | 10-2017-0124031 A | 11/2017 |
| WO | 2012/143817 A2 | 10/2012 |
| WO | 2017/057387 A1 | 4/2017 |

* cited by examiner

300: 310a, 310b, 310c, 310d

◇ RP
○ GP
◇ BP

DISPLAY DEVICE AND METHOD OF MANUFACTURING THE SAME

CROSS-REFERENCE TO RELATED APPLICATION

This application claims priority to and the benefit of Korean Patent Application No. 10-2018-0114435, filed on Sep. 21, 2018 in the Korean Intellectual Property Office, the entire content of which is incorporated herein by reference.

BACKGROUND

1. Field

One or more aspects of example embodiments of the present disclosure relate to a display device and a method of manufacturing the same.

2. Description of the Related Art

A head mounted display (HMD) is a display device that can be worn on the head of a user or as part of a helmet or glasses and can form a focal point at a distance close to the eyes of the user. The HMD can be utilized for virtual reality (VR) or augmented reality (AR).

The HMD may include an eyepiece on which the eyes of the user can be placed and a display module which displays an image. In the HMD, the eyepiece is disposed between the eyes of the user, and the display module, which displays an image, is disposed within the focal length of the eyepiece. As a result, when the display module displays an image, the user can view a virtual image enlarged from the displayed image via the eyepiece.

However, the eyepiece is generally thick because it consists of convex lenses having a large volume. Accordingly, the entire HMD becomes thick, and the design freedom of the HMD is low.

SUMMARY

One or more aspects of example embodiments of the present disclosure provide a display device applicable to a head mounted display (HMD) that can be slimmed down by eliminating an eyepiece.

One or more aspects of example embodiments of the present disclosure also provide a method of manufacturing a display device applicable to an HMD that can be slimmed down by eliminating an eyepiece.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

One or more example embodiments of the present disclosure provide a display device including a display panel including a series of pixels, each of the pixels including N sub-pixels, where N is an integer of 2 or greater, and a lens array on a surface of the display panel and including a series of lenses, wherein each of the lenses overlaps with M sub-pixels, where M is an integer greater than N.

Each of the pixels may include a first sub-pixel configured to display a first color, a second sub-pixel configured to display a second color, a third sub-pixel configured to display a third color, and a fourth sub-pixel configured to display the second color.

The lens array may include a first lens, a second lens, a third lens, and a fourth lens. The first lens may overlap with a first sub-pixel and second sub-pixels, the second lens may overlap with first sub-pixels, a second sub-pixel, and third sub-pixels, the third lens may overlap with second sub-pixels and a third sub-pixel, and the fourth lens may overlap with first sub-pixels, a second sub-pixel, and third sub-pixels.

The lens array may include a first lens, a second lens, a third lens, and a fourth lens. Second sub-pixels may be disposed at edges of the first and third lenses, and first sub-pixels and third sub-pixels may be disposed at edges of the second and fourth lenses.

The edges of the first and third lenses may overlap with the second sub-pixels, and the edges of the second and fourth lenses may overlap with the first sub-pixels and the third sub-pixels.

A part of one of the second sub-pixels disposed at the edge of the first lens may not overlap with the edge of the first lens.

A part of one of the first sub-pixels disposed at the edge of the second lens may not overlap with the edge of the second lens, and a part of one of the third sub-pixels disposed at the edge of the second lens may not overlap with the edge of the second lens.

Among the first sub-pixel and the second sub-pixels overlapping with the first lens, the first sub-pixel and a first pair of second sub-pixels may be arranged in parallel to one another in a first direction, and the first sub-pixel and a second pair of second sub-pixels may be arranged in parallel to one another in a second direction that intersects the first direction.

The first pair of second sub-pixels may be symmetrical with each other with respect to the first sub-pixel, and the second pair of second sub-pixels may be symmetrical with each other with respect to the first sub-pixel.

One second sub-pixel of the first pair of second sub-pixels may be configured to display a first view image, the other second sub-pixel of the first pair of second sub-pixels may be configured to display a fifth view image, the first sub-pixel may be configured to display a second view image, one second sub-pixel of the second pair of second sub-pixels may be configured to display a third view image, and the other second sub-pixel of the second pair of second sub-pixels may display a fourth view image.

The first, second, third, fourth, and fifth view images may be provided to first, second, third, fourth, and fifth view regions, respectively, by the first lens.

A maximum distance between a pair of adjacent view images among the first, second, third, fourth, and fifth view images may be about 3 mm or less.

A maximum distance between the first pair of second sub-pixels or between the second pair of second sub-pixels may be smaller than a pitch of the first lens.

Among the first sub-pixels, the second sub-pixel, and the third sub-pixels overlapping with the second lens or the fourth lens, the second sub-pixel and the third sub-pixels may be arranged in parallel to one another, and the first sub-pixels and the second sub-pixel may be arranged in parallel to one another.

The first sub-pixels may be symmetrical with each other with respect to the second sub-pixel, and the third sub-pixels may be symmetrical with each other with respect to the second sub-pixel.

Among the first sub-pixels, the second sub-pixel, and the third sub-pixels overlapping with the second lens, one of the first sub-pixels may d be configured to display a first view image, another first sub-pixel may be configured to display a fifth view image, the second sub-pixel may be configured to display a second view image, one of the third sub-pixels may be configured to display a third view image, and another third sub-pixel may be configured to display a fourth view image.

Among the first sub-pixels, the second sub-pixel, and the third sub-pixels overlapping with the fourth lens, one of the third sub-pixels may be configured to display a first view image, another third sub-pixel may be configured to display a fifth view image, the second sub-pixel may be configured to display a second view image, one of the first sub-pixels may be configured to display a third view image, and another first sub-pixel may be configured to display a fourth view image.

Among the second sub-pixels and the third sub-pixel overlapping with the third lens, the third sub-pixel and a first pair of second sub-pixels may be arranged in parallel to one another in a first direction, and the third sub-pixel and a second pair of second sub-pixels may be arranged in parallel to one another in a second direction that intersects the first direction.

The first pair of second sub-pixels may be symmetrical with each other with respect to the third sub-pixel, and the second pair of second sub-pixels may be symmetrical with each other with respect to the third sub-pixel.

One second sub-pixel of the first pair of second sub-pixels may be configured to display a first view image, the other second sub-pixel of the first pair of second sub-pixels may be configured to display a fifth view image, the third sub-pixel may be configured to display a second view image, one second sub-pixel of the second pair of second sub-pixels may be configured to display a third view image, and the other second sub-pixel of the second pair of second sub-pixels may be configured to display a fourth view image.

The display device may also include a gap maintaining member between the display panel and the lens array, and the lens array may further include a lens planarization film covering the series of lenses. A difference between a refractive index of the series lenses and a refractive index of the lens planarization film may be greater than a difference between the refractive index of the series of lenses and a refractive index of the gap maintaining member.

The difference between the refractive index of the series of lenses and the refractive index of the lens planarization film may be about 0.3 or greater.

One or more example embodiments of the present disclosure provide a method of manufacturing a display device, including placing a gap maintaining member on a display panel; applying photoresist on the gap maintaining member; placing a mask over the photoresist and applying ultraviolet (UV) light; forming a series of lenses by developing the photoresist; and forming a lens planarization film on the lenses. A difference between a refractive index of the series of lenses and a refractive index of the lens planarization film may be greater than a difference between the refractive index of the series of lenses and a refractive index of the gap maintaining member.

According to the aforementioned and other example embodiments of the present disclosure, since a lens array including lenses is on a display panel, a series of view images can be provided to a location where the eyes of a user are placed. Thus, an enlarged virtual image from an image actually displayed by a display panel can be provided to the user without the aid of an eyepiece. Accordingly, an eyepiece can be eliminated, and as a result, the thickness of a display device can be considerably reduced.

Also, since view images displayed by the same combination of sub-pixels included in each pixel can be provided to view regions, white gradation can be displayed in each of the view regions.

Also, since view regions are formed so that the maximum distance between a pair of adjacent view regions is about 3 mm or less, at least two view images can be provided to each of the eyes of the user.

Also, since view images displayed by sub-pixels are enlarged and displayed in view images via lenses, a screen door effect in which a black matrix is enlarged and viewed as a lattice can be prevented.

Also, since the lens array including the lenses is formed directly on the display panel, alignment error between the lenses and sub-pixels can be reduced.

Other features and example embodiments may be apparent from the following detailed description, the drawings, and the claims.

BRIEF DESCRIPTION OF THE DRAWINGS

The above and other example embodiments and features of the present disclosure will become more apparent by describing in detail example embodiments thereof with reference to the attached drawings, in which.

DETAILED DESCRIPTION

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, embodiments of the present disclosure will be described with reference to the attached drawings.

Figure 1:
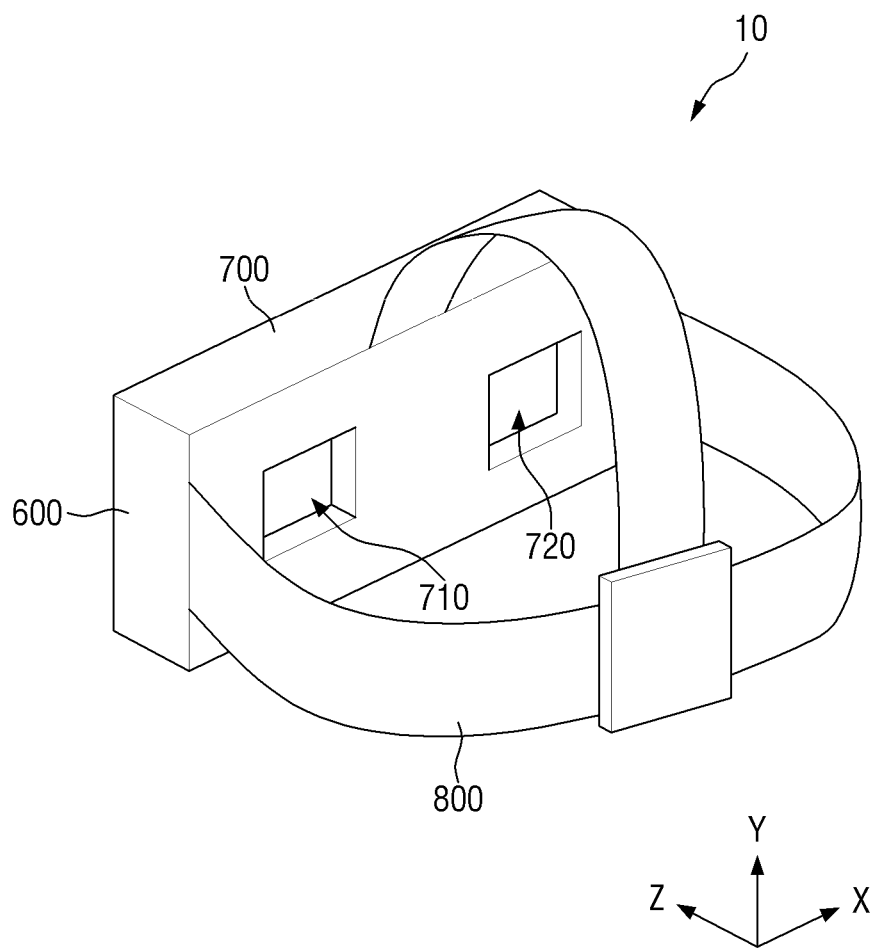
FIG. 1 is a perspective view of a display device according to an example embodiment of the present disclosure.
Figure 2:
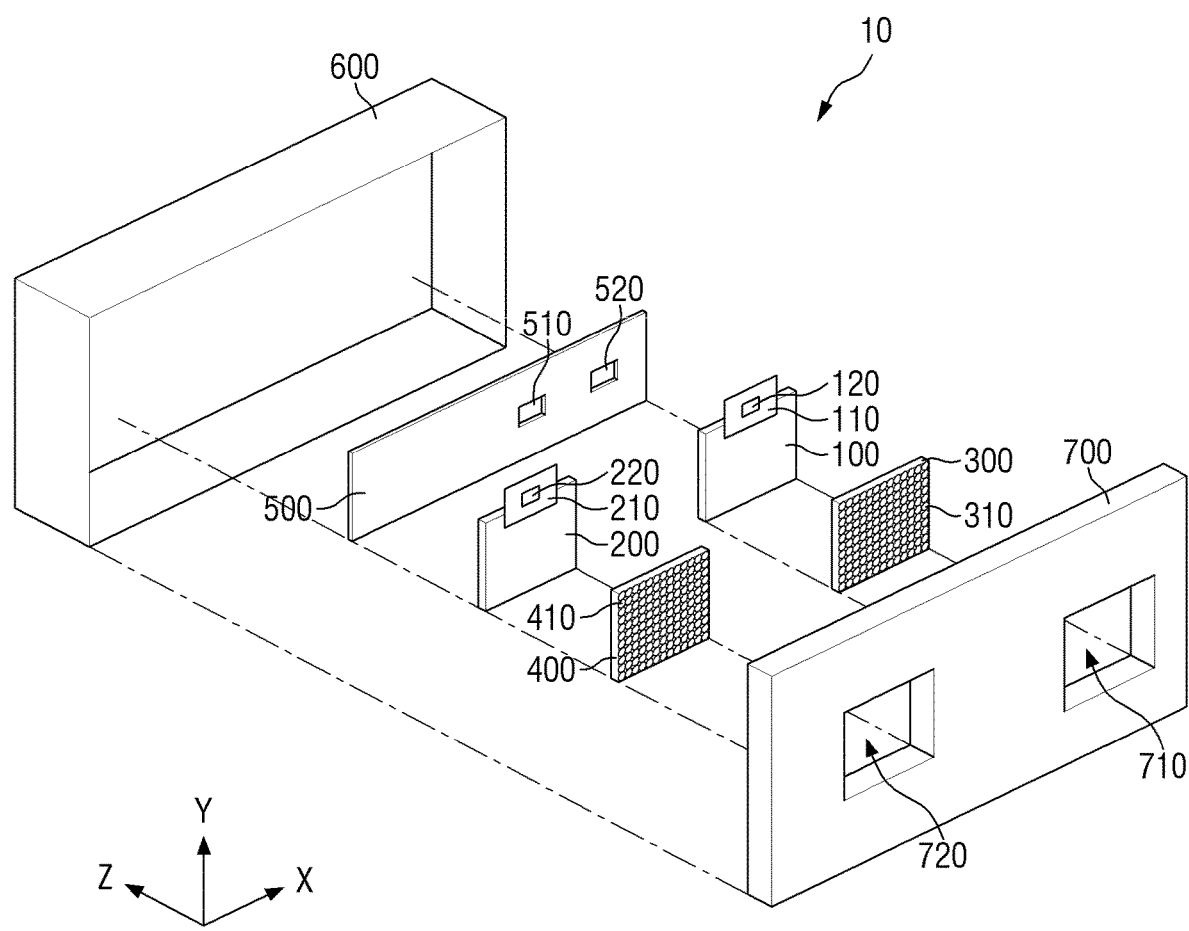
FIG. 2 is an exploded perspective view of the display device of FIG. 1.

FIG. 1 is a perspective view of a display device according to an example embodiment of the present disclosure. FIG. 2 is an exploded perspective view of the display device of FIG. 1.

Referring to FIGS. 1 and 2, a display device 10 includes a first display panel 100, a first circuit board 110, a first display driving unit 120, a second display panel 200, a second circuit board 210, a second display driving unit 220, a first lens array 300, a second lens array 400, a control circuit board 500, a main control unit 510, a power supply unit 520, a display panel storage unit 600, a storage cover 700, and a head mounted band 800. The display device 10 may be a head mounted display (HMD).

Figure 13:
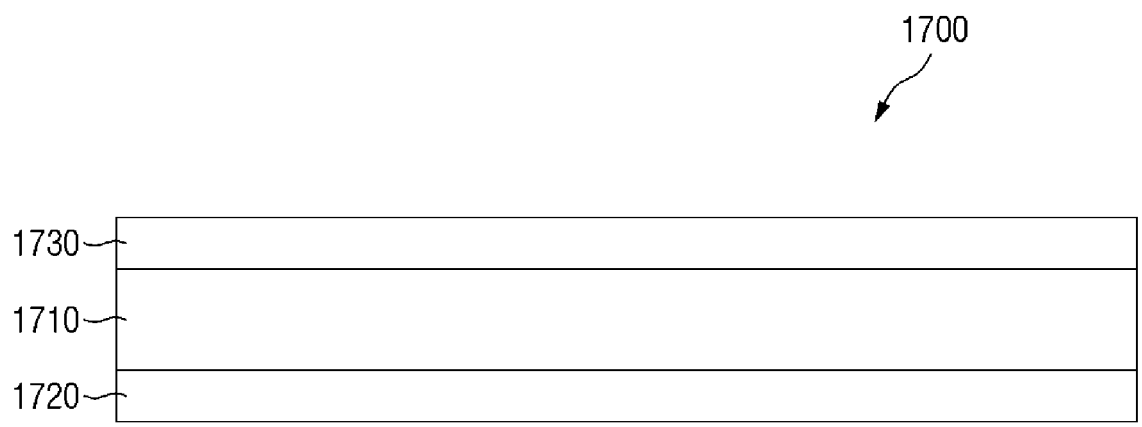
FIG. 13 is a side view illustrating a gap maintaining member of FIG. 12.

The first display panel 100 provides an image to the right eye of a user, and the second display panel 200 provides an image to the left eye of the user. The first and second display panels 100 and 200 may be organic light-emitting diode (OLED) display panels using OLEDs, micro light-emitting diode (mLED) display panels using mLEDs, quantum dot light-emitting diode (QLED) display devices using QLEDs, liquid crystal one silicon substrates (LCoSs), or organic light-emitting diode on silicon substrates (OLEDoSs). The first and second display panels 100 and 200 will hereinafter be described as being, for example, OLED display panels, as illustrated in FIG. 13.

Each of the first and second display panels 100 and 200 includes a plurality of sub-pixels disposed on a substrate. Data lines and scan lines are disposed on the substrate to intersect each other, and the plurality of sub-pixels are arranged in a matrix due to the intersections between the data lines and the scan lines. Each of the plurality of sub-pixels may be connected to at least one of the data lines and at least one of the scan lines. As a result, in response to scan signals being applied to the scan lines, the plurality of sub-pixels receives data voltages from the data lines and emit light according to the data voltages. The first and second display panels 100 and 200 will be described later with reference to FIGS. 3 and 13.

The first circuit board 110 may be attached to pads provided at one edge of the first display panel 100. The second circuit board 210 may be attached to pads provided at one edge of the second display panel 200. The first and second circuit boards 110 and 210 may be flexible printed circuit boards or chip-on-films.

The first display driving unit 120 may be attached on the first circuit board 110. The first driving unit 120 receives digital video data and timing signals from the main control unit 510, applies data voltages to the data lines of the first display panel 100 in accordance with the received timing signals, and provides scan driving signals to a scan driving unit, which provides scan signals to the scan lines of the first display panel 100.

The second display driving unit 220 may be mounted on the second circuit board 210. The second display driving unit 220 receives digital video data and timing signals from the main control unit 510, applies data voltages to the data lines of the second display panel 200 in accordance with the received timing signals, and provides scan driving signals to the scan driving unit, which provides scan signals to the scan lines of the second display panel 200.

The first and second display driving units 120 and 220 may be formed as integrated circuits.

The first lens array 300 may be disposed between the first display panel 100 and the storage cover 700. The first lens array 300 may include a plurality of lenses 310. The lenses 310 may be formed as convex lenses that are convex toward the storage cover 700.

The second lens array 400 may be disposed between the second display panel 200 and the storage cover 700. The second lens array 400 may include a plurality of lenses 410. The lenses 410 may be formed as convex lenses that are convex toward the storage cover 700.

The control circuit board 500 may be disposed between the first display panel 100 and the display panel storage unit 600 and between the second display panel 200 and the display panel storage unit 600. The control circuit board 500 may be connected to the first circuit board 110 via a first cable. The first cable may be connected between the connector of the control circuit board 500 and the connector of the first circuit board 110. The control circuit board 500 may be connected to the second circuit board 210 via a second cable. The second cable may be connected between the connector of the control circuit board 500 and the connector of the second circuit board 210.

The main control unit 510 and the power supply unit 520 may be mounted on the control circuit board 500. The main control unit 510 controls all the functions of the display device 10. For example, the main control unit 510 may output first image data to the first display driving unit 120 of the first circuit board 110 so as to cause the first display panel 100 to display an image. Also, the main control unit 510 may output first image data to the second display driving unit 220 of the second circuit board 210 so as to cause the second display panel 200 to display an image. The main control unit 510 may control the first and second display panels 100 and 200 to display the same image. Alternatively, the main control unit 510 may control the first and second display panels 100 and 200 to display right- and left-eye images, respectively, optimized for the right and left eyes, respectively, of the user. Additionally, in one or more embodiments, the main control unit 510 may control the first and second display panels 100 and 200 to display right- and left-eye stereoscopic images, respectively, to generate a stereoscopic image.

The main control unit 510 may be an application processor, a central processing unit, or a system chip including an integrated circuit.

The power supply unit 520 supplies voltages necessary for all the elements of the display device 10. For example, the power supply unit 520 may generate and supply voltages necessary for driving the main control unit 510, the first display driving unit 120, and the second display driving unit 220. Also, the power supply unit 520 may generate first and second power supply voltages and may supply the first and second power supply voltages to the first and second display panels 100 and 200. In an embodiment where the first and second display panels 100 and 200 are OLED display panels, the first power supply voltage may be a high-potential voltage applied to the anode electrodes of OLEDs, and the second power supply voltage may be a low-potential voltage applied to the cathode electrodes of OLEDs.

The display panel storage unit 600 accommodates the first display panel 100, the second display panel 200, the first lens array 300, the second lens array 400, and the control circuit board 500. One side of the display panel storage unit 600 may be open in order to accommodate the first display panel 100, the second display panel 200, the first lens array 300, the second lens array 400, and the control circuit board 500. The shape of the display panel storage unit 600 is not limited to the shape illustrated in FIGS. 1 and 2, and the display panel storage unit 600 may have any other suitable shape.

The storage cover 700 is disposed to cover the open side of the display panel storage unit 600. The storage cover 700 may include a first opening 710 in which the right eye of the user is to be placed and a second opening 720 in which the left eye of the user is to be placed. FIGS. 1 and 2 illustrate an example in which the first and second openings 710 and 720 are rectangular in shape, but the present disclosure is not limited thereto. In another example embodiment, the first and second openings 710 and 720 may be circular or elliptical in shape. Alternatively, the first and second openings 710 and 720 may be integrated into a single opening.

The first opening 710 may be aligned with the first display panel 100 and the first lens array 300, and the second opening 720 may be aligned with the second display panel 200 and the second lens array 300. Accordingly, the user may view a virtual image, which is enlarged, via the first lens array 300, from an image displayed by the first display panel 100, through the first opening 710 and may view a virtual image, which is enlarged, via the second lens array 400, from an image displayed by the second display panel 200, through the second opening 720.

According to the example embodiment of FIGS. 1 and 2, because the image displayed by the first display panel 100 can be enlarged to a virtual image via the first lens array 300 and the image displayed by the second display panel 200 can be enlarged to a virtual image via the second lens array 400, the display device 10 may not include any eyepiece in the storage cover 700. Therefore, the thickness of the display device 10 can be reduced considerably compared to a related art display device with an eyepiece for enlarging the display images.

In a case where the display device 10 is applied to an HMD, the head mounted band 800 fixes the display panel storage unit 600 to the head of the user so that the first and second openings 710 and 720 of the storage cover 700 can be placed on the right and left eyes, respectively, of the user. The head mounted band 800 may be connected to the top surface, the left side, and the right side of the display panel storage unit 600.

In a case where the display panel storage unit 600 is lightweight and is compact in size, the display device 10 may include a spectacle frame, instead of the head mounted band 800.

The display device 10 may further include a battery for supplying power to the power supply unit 520, an external memory slot for housing an external memory, and an external connection port and a wireless communication chip for receiving an image source. The external connection port may be a universal serial bus (USB) terminal, a display port, or a high-definition multimedia interface (HDMI) terminal, and the wireless communication chip may be a WiFi chip or a Bluetooth chip.

Figure 3:
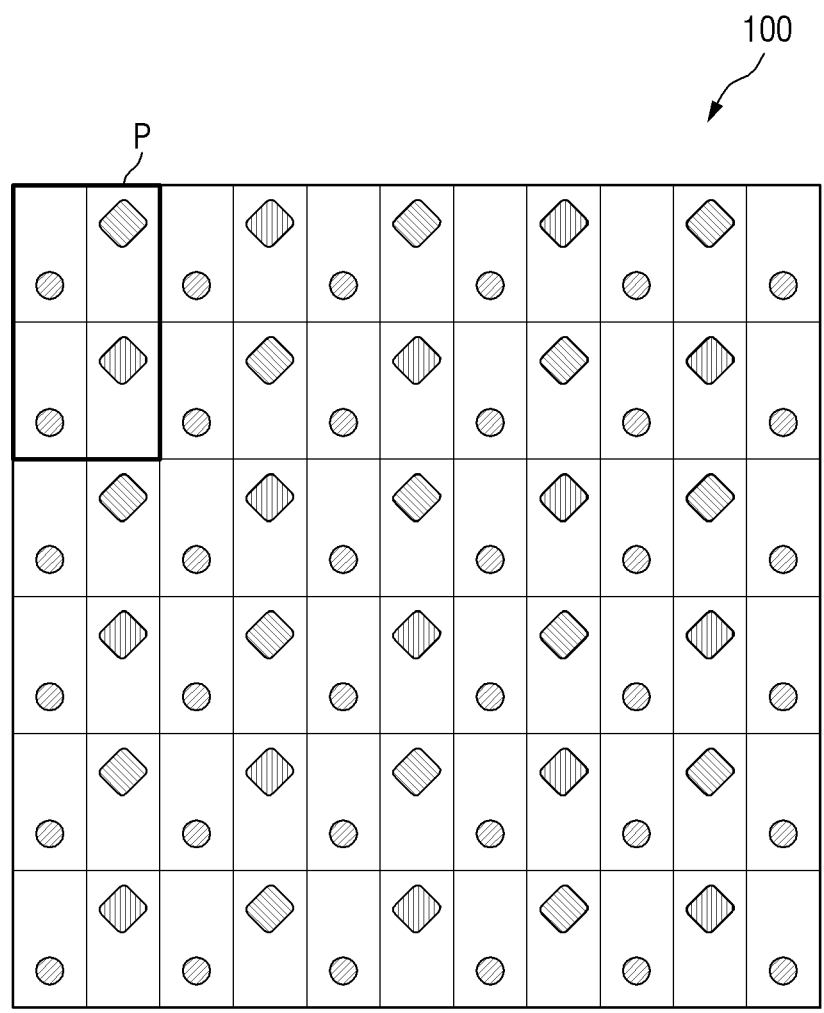
FIG. 3 is a plan view illustrating sub-pixels of a first display panel of FIG. 1.

FIG. 3 is a plan view illustrating sub-pixels of the first display panel 100 of FIG. 1.

Referring to FIG. 3, the first display panel 100 includes a plurality of sub-pixels. For example, the first display panel 100 may include first sub-pixels RP, second sub-pixels GP, and third sub-pixels BP. The first sub-pixels RP may display a first color, the second sub-pixels GP may display a second color, and the third sub-pixels BP may display a third color. The first, second, and third colors may be red, green, and blue, respectively, but the present disclosure is not limited thereto.

The second sub-pixels GP may be arranged in parallel in a column direction (or a Y-axis direction), and the first sub-pixels RP and the third sub-pixels BP may be arranged in parallel in the column direction (or the Y-axis direction). The second sub-pixels GP may be arranged in odd-numbered columns, and the first sub-pixels RP and the third sub-pixels BP may be alternately arranged in each even-numbered column.

The first sub-pixels RP, and the second sub-pixels GP and the third sub-subpixels BP may be arranged in zigzags (e.g., a sawtooth pattern) in a row direction (or a X-axis direction). Also, the first sub-pixels RP, and the second sub-pixels GP and the third sub-subpixels BP may be arranged in the following order: the second sub-pixel GP, the first sub-pixel RP, the second sub-pixel GP, and the third sub-pixel BP in the row direction (or the X-axis direction).

The first display panel 100 may display white gradation in units of pixels P. Each of the pixels P may include N sub-pixels (where N is an integer of 2 or greater). For example, each of the pixels P may include one first sub-pixel RP, two second sub-pixels GP, and one third sub-pixel BP that are adjacent to one another. In this example embodiment, the number of first sub-pixels RP provided in the first display panel 100 and the number of third sub-pixels BP provided in the first display panel 100 may be the same. In the first display panel 100, the number of second sub-pixels GP may be twice the number of first sub-pixels RP and twice the number of third sub-pixels BP. Also, in the first display panel 100, the number of second sub-pixels GP may be the same as the sum of the number of first sub-pixels RP and the number of third sub-pixels BP.

In a plan view, the first sub-pixels RP may be larger in size than the second sub-pixels GP. In a plan view, the third sub-pixels BP may be larger in size than the second sub-pixels GP. In a plan view, the first sub-pixels RP may be of substantially the same size as the third sub-pixels BP. In a plan view, the first sub-pixels RP and the third-sub pixels BP may be rhombic in shape. In a plan view, the second sub-pixels GP may be circular in shape.

Figure 4:
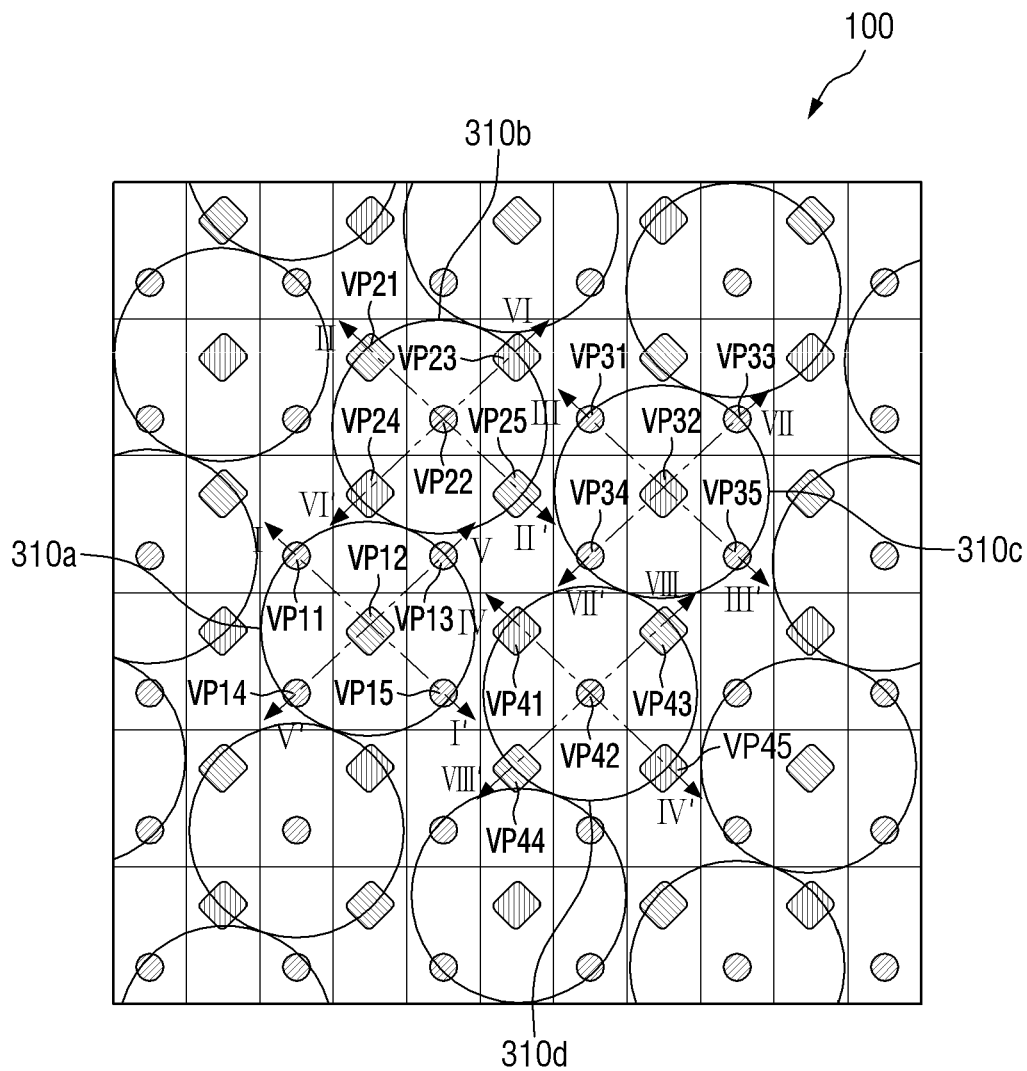
FIG. 4 is a plan view illustrating the arrangement of lenses in a first lens array on the sub-pixels of the first display panel of FIG. 3.
Figure 4:
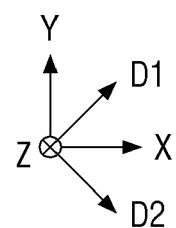

FIG. 4 is a plan view illustrating the arrangement of lenses in the first lens array on the sub-pixels of the first display panel of FIG. 3.

Referring to FIG. 4, the first lens array 300 includes a plurality of lenses 310. The lenses 310 of the first lens array 300 may be disposed on the sub-pixels (RP, GP, and BP) of the first display panel 100.

Each of the lenses 310 may include first, second, third, and fourth lenses 310a, 310b, 310c, and 310d. Each of the first, second, third, and fourth lenses 310a, 310b, 310c, and 310d may overlap with M sub-pixels (where M is an integer greater than N). For example, each of the pixels P may include four sub-pixels, and each of the first, second, third, and fourth lenses 310a, 310b, 310c, and 310d may overlap with five sub-pixels.

The first lens 310a may overlap with four second sub-pixels GP and one first sub-pixel RP. In the first lens 310a, the first sub-pixel RP may be arranged at the center, and the four second sub-pixels GP may be arranged around the first sub-pixel RP in two diagonal directions in an "X"-shaped arrangement. For example, the four second sub-pixels GP may be disposed on the upper left, upper right, lower left, and lower right sides of the first sub-pixel RP. In this example embodiment, two of the second sub-pixels GP and the first sub-pixel RP may be arranged in parallel in a first direction D1, and the two second sub-pixels GP may be symmetrical with each other with respect to the first sub-pixel RP. Also, in this example, the other two second sub-pixels GP and the first sub-pixel RP may be arranged in parallel in a second direction D2 that intersects the first direction D1, and the other two second sub-pixels GP may also be symmetrical with each other with respect to the first sub-pixel RP. The first direction D1 may be an upper right direction "↗", and the second direction D2 may be an upper left direction "↖".

In the first lens 310a, the second sub-pixel GP disposed on the upper left side of the first sub-pixel RP may be a (1-1)-th view pixel VP11 displaying a first view image, and the first sub-pixel RP may be a (1-2)-th view pixel VP12 displaying a second view image. In the first lens 310a, the second sub-pixel GP disposed on the upper right side of the first sub-pixel RP may be a (1-3)-th view pixel VP13 displaying a third view image. In the first lens 310a, the second sub-pixel GP disposed on the lower left side of the first sub-pixel RP may be a (1-4)-th view pixel VP14 displaying a fourth view image. In the first lens 310a, the second sub-pixel GP disposed on the lower right side of the first sub-pixel RP may be a (1-5)-th view pixel VP15 displaying a fifth view image.

The second lens 310b may overlap with two first sub-pixels RP, one second sub-pixel GP, and two third sub-pixels BP. In the second lens 310b, the second sub-pixel GP may be arranged at the center, the two first sub-pixels RP and the two third sub-pixels BP may be arranged around the second sub-pixel GP in two diagonal directions in an "X"-shaped arrangement. For example, the two first sub-pixels RP may be disposed on the upper left and lower right sides of the second sub-pixel GP, and the two third sub-pixels BP may be disposed on the upper right and lower left sides of the second sub-pixel GP. In this example embodiment, the two third sub-pixels BP and the second sub-pixel GP may be arranged in parallel in the first direction D1, and the two third sub-pixels BP may be symmetrical with each other with respect to the second sub-pixel GP. Also, in this example embodiment, the two first sub-pixels RP and the second sub-pixel GP may be arranged in parallel in the second direction D2, and the two first sub-pixels RP may be symmetrical with each other with respect to the second sub-pixel GP.

In the second lens 310b, the first sub-pixel RP disposed on the upper left side of the second sub-pixel GP may be a (2-1)-th view pixel VP21 displaying a first view image, and the second sub-pixel GP may be a (2-2)-th view pixel VP22 displaying a second view image. In the second lens 310b, the first sub-pixel RP disposed on the upper right side of the second sub-pixel GP may be a (2-3)-th view pixel VP23 displaying a third view image. In the second lens 310b, the first sub-pixel RP disposed on the lower left side of the second sub-pixel GP may be a (2-4)-th view pixel VP24 displaying a fourth view image. In the second lens 310b, the first sub-pixel RP disposed on the lower right side of the second sub-pixel GP may be a (2-5)-th view pixel VP25 displaying a fifth view image.

The third lens 310c may overlap with four second sub-pixels GP and one third sub-pixel BP. In the third lens 310c, the third sub-pixel BP may be arranged at the center, and the four second sub-pixels GP may be arranged around the third sub-pixel BP in two diagonal directions in an "X"-shaped arrangement. For example, the four second sub-pixels GP may be arranged on the upper left, upper right, lower left, and lower right sides of the first sub-pixel RP. In this example embodiment, two of the second sub-pixels GP and the third sub-pixel BP may be arranged in parallel in the first direction D1, and the two second sub-pixels GP may be symmetrical with each other with respect to the third sub-pixel BP. Also, in this example embodiment, the other two second sub-pixels GP and the third sub-pixel BP may be arranged in parallel in the second direction D2 that intersects the first direction D1, and the other two second sub-pixels GP may be symmetrical with each other with respect to the third sub-pixel BP.

In the third lens 310c, the second sub-pixel GP disposed on the upper left side of the third sub-pixel BP may be a (3-1)-th view pixel VP31 displaying a first view image, and the third sub-pixel BP may be a (3-2)-th view pixel VP32 displaying a second view image. In the third lens 310c, the second sub-pixel GP disposed on the upper right side of the third sub-pixel BP may be a (3-3)-th view pixel VP33 displaying a third view image. In the third lens 310c, the second sub-pixel GP disposed on the lower left side of the third sub-pixel BP may be a (3-4)-th view pixel VP34 displaying a fourth view image. In the third lens 310c, the second sub-pixel GP disposed on the lower right side of the third sub-pixel BP may be a (3-5)-th view pixel VP35 displaying a fifth view image.

The fourth lens 310d may overlap with two first sub-pixels RP, one second sub-pixel GP, and two third sub-pixels BP. In the fourth lens 310d, the second sub-pixel GP may be arranged at the center, the two first sub-pixels RP and the two third sub-pixels BP may be arranged around the second sub-pixel GP in two diagonal directions in an "X"-shaped arrangement. For example, the two first sub-pixels RP may be disposed on the upper right and lower left sides of the second sub-pixel GP, and the two third sub-pixels BP may be disposed on the upper left and lower right ides of the second sub-pixel GP. In this example embodiment, the two first sub-pixels RP and the second sub-pixel GP may be arranged in parallel in the first direction D1, and the two first sub-pixels RP may be symmetrical with each other with respect to the second sub-pixel GP. Also, in this example embodiment, the two third sub-pixels BP and the second sub-pixel GP may be arranged in parallel in the second direction D2, and the two third sub-pixels BP may be symmetrical with each other with respect to the second sub-pixel GP.

In the fourth lens 310d, the third sub-pixel BP disposed on the upper left side of the second sub-pixel GP may be a (4-1)-th view pixel VP41 displaying a first view image, and the second sub-pixel GP may be a (4-2)-th view pixel VP42 displaying a second view image. In the fourth lens 310d, the third sub-pixel BP disposed on the upper right side of the second sub-pixel GP may be a (4-3)-th view pixel VP43 displaying a third view image. In the fourth lens 310d, the third sub-pixel BP disposed on the lower left side of the second sub-pixel GP may be a (4-4)-th view pixel VP44 displaying a fourth view image. In the fourth lens 310d, the third sub-pixel BP disposed on the lower right side of the second sub-pixel GP may be a (4-5)-th view pixel VP45 displaying a fifth view image.

Figure 5:
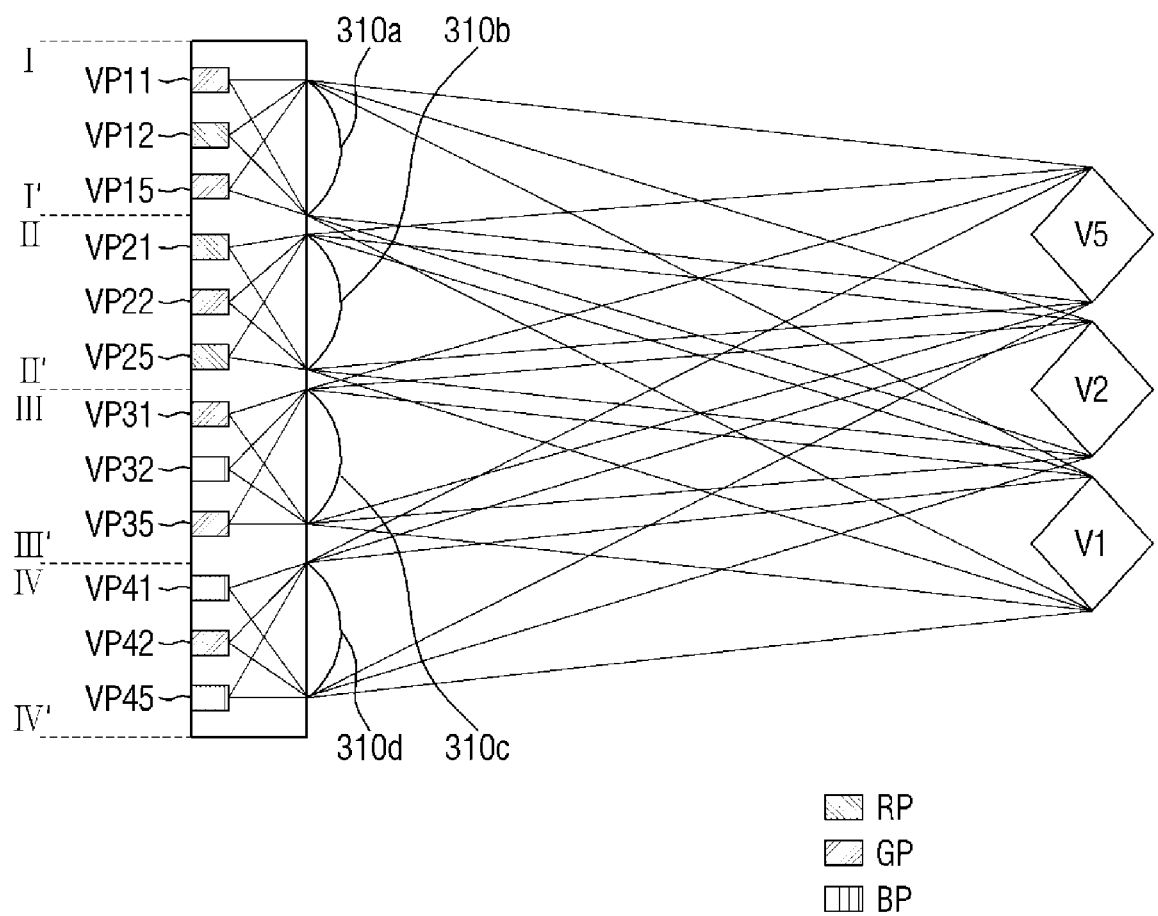
FIG. 5 is a cross-sectional view taken along lines I-I', II-II', III-III', and IV-IV' of FIG. 4.
Figure 6:
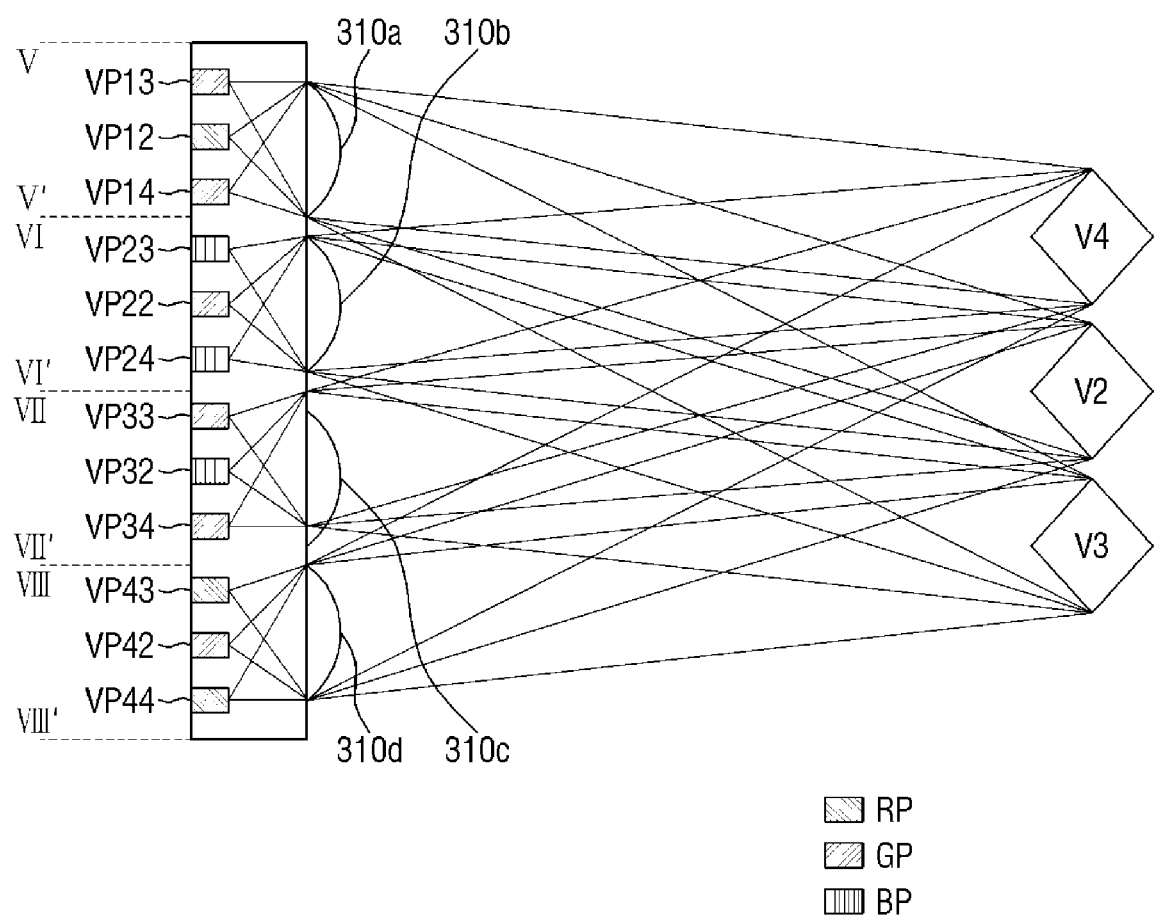
FIG. 6 is a cross-sectional view taken along lines V-V', VI-VI', VII-VII', and VIII-VIII' of FIG. 4.

According to the example embodiment of FIGS. 4 through 6, since the (1-1)-th and (3-1)-th sub-pixels VP11 and VP31, which display a first view image, are second sub-pixels GP, the (2-1)-th view pixel VP12 is a first sub-pixel RP and the (4-1)-th sub-pixel VP41 is a third sub-pixel BP, a first view image displayed by the same combination of sub-pixels as that in each of the pixels P may be provided to the first view region V1. Similarly, second, third, fourth, and fifth view images may be provided to second, third, fourth, and fifth view regions V2, V3, V4, and V5, respectively. Accordingly, white gradation can be displayed in each of the first, second, third, fourth, and fifth view regions V1, V2, V3, V4, and V5.

The first, second, third, and fourth lenses 310a, 310b, 310c, and 310d may be formed as convex lenses. First, second, third, fourth, and fifth view images displayed by the sub-pixels (RP, GP, and BP) may be provided to the first, second, third, fourth, and fifth view regions V1, V2, V3, V4, and V5, respectively, by the first, second, third, and fourth lenses 310a, 310b, 310c, and 310d.

Referring to FIG. 5, a first view image displayed by the (1-1)-th view pixel VP11 may be provided to the first view region V1 by the first lens 310a, a second view image displayed by the (1-2)-th view pixel VP12 may be provided to the second view region V2 by the first lens 310a, and a fifth view image displayed by the (1-5)-th view pixel VP15 may be provided to the fifth view region V5 by the first lens 310a. Also, a first view image displayed by the (2-1)-th view pixel VP21 may be provided to the first view region V1 by the second lens 310b, a second view image displayed by the (2-2)-th view pixel VP22 may be provided to the second view region V2 by the second lens 310b, and a fifth view image displayed by the (2-5)-th view pixel VP55 may be provided to the fifth view region V5 by the second lens 310b. Also, a first view image displayed by the (3-1)-th view pixel VP31 may be provided to the first view region V1 by the third lens 310c, a second view image displayed by the (3-2)-th view pixel VP32 may be provided to the second view region V2 by the third lens 310c, and a fifth view image displayed by the (3-5)-th view pixel VP35 may be provided to the fifth view region V5 by the third lens 310c. Also, a first view image displayed by the (4-1)-th view pixel VP41 may be provided to the first view region V1 by the fourth lens 310d, a second view image displayed by the (4-2)-th view pixel VP42 may be provided to the second view region V2 by the fourth lens 310d, and a fifth view image displayed by the (4-5)-th view pixel VP45 may be provided to the fifth view region V5 by the fourth lens 310d.

Also, referring to FIG. 6, a third view image displayed by the (1-3)-th view pixel VP13 may be provided to the third view region V3 by the first lens 310a, a second view image displayed by the (1-2)-th view pixel VP12 may be provided to the second view region V2 by the first lens 310a, and a fourth view image displayed by the (1-4)-th view pixel VP14 may be provided to the fourth view region V4 by the first lens 310a. Also, a third view image displayed by the (2-3)-th view pixel VP23 may be provided to the third view region V3 by the second lens 310b, a second view image displayed by the (2-2)-th view pixel VP22 may be provided to the second view region V2 by the second lens 310b, and a fourth view image displayed by the (2-4)-th view pixel VP24 may be provided to the fifth view region V5 by the second lens 310b. Also, a third view image displayed by the (3-3)-th view pixel VP33 may be provided to the third view region V3 by the third lens 310c, a second view image displayed by the (3-2)-th view pixel VP32 may be provided to the second view region V2 by the third lens 310c, and a fourth view image displayed by the (3-4)-th view pixel VP34 may be provided to the fourth view region V4 by the third lens 310c. Also, a third view image displayed by the (4-3)-th view pixel VP43 may be provided to the third view region V3 by the fourth lens 310d, a second view image displayed by the (4-2)-th view pixel VP42 may be provided to the second view region V2 by the fourth lens 310d, and a fourth view image displayed by the (4-4)-th view pixel VP44 may be provided to the fourth view region V4 by the fourth lens 310d.

The sub-pixel disposed on the upper left side of each of the first, second, third, and fourth lenses 310a, 310b, 310c, and 310d displays a first view image, the sub-pixel disposed at the center of each of the first, second, third, and fourth lenses 310a, 310b, 310c, and 310d displays a second view image, the sub-pixel disposed on the upper right side of each of the first, second, third, and fourth lenses 310a, 310b, 310c, and 310d displays a third view image, the sub-pixel disposed on the lower left side of each of the first, second, third, and fourth lenses 310a, 310b, 310c, and 310d displays a fourth view image, and the sub-pixel disposed on the lower right side of each of the first, second, third, and fourth lenses 310a, 310b, 310c, and 310d displays a fifth view image. As a result, referring to FIG. 7, the first view region V1 realized by the first, second, third, and fourth lenses 310a, 310b, 310c, and 310d may be disposed on the upper left side, the second view region V2 realized by the first, second, third, and fourth lenses 310a, 310b, 310c, and 310d may be disposed at the center, the third view region V3 realized by the first, second, third, and fourth lenses 310a, 310b, 310c, and 310d may be disposed on the upper right side, the fourth view region V4 realized by the first, second, third, and fourth lenses 310a, 310b, 310c, and 310d may be disposed on the lower left side, and the fifth view region V5 realized by the first, second, third, and fourth lenses 310a, 310b, 310c, and 310d may be disposed on the lower right side. That is, the first, second, third, fourth, and fifth view regions may be arranged in an X-shaped arrangement.

Figure 7:
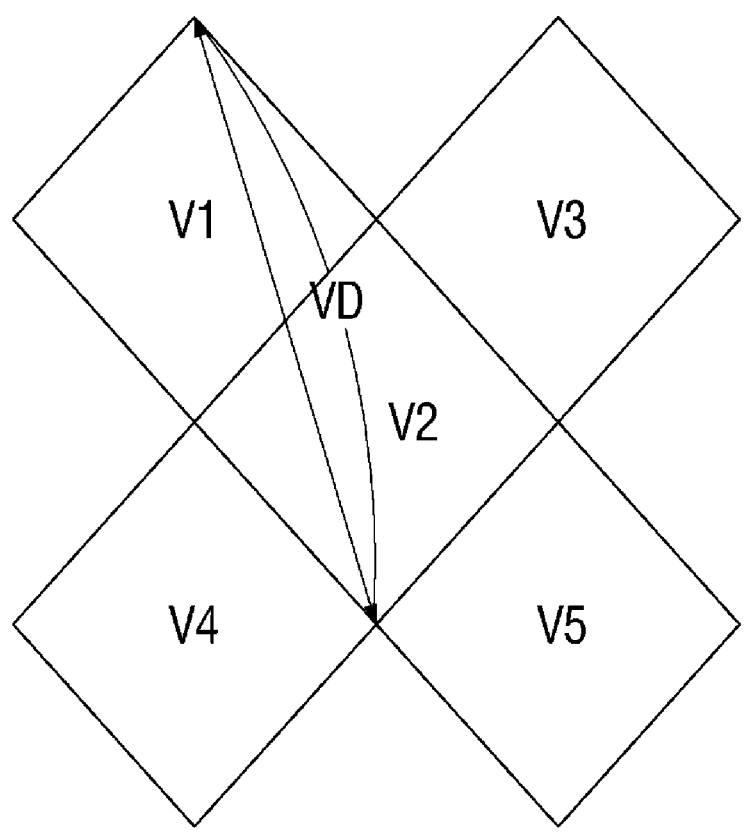
FIG. 7 is a schematic view illustrating first through fifth view regions that can be viewed by a user via first, second, third, and fourth lenses.

In order for the user to properly view an image, at least two of first, second, third, fourth, and fifth view images may be provided to one of the eyes of the user. Since the size of the human pupil is about 3 mm to 6 mm, in one or more embodiments, a maximum distance VD between two adjacent view regions may be 3 mm or less, as illustrated in FIG. 7.

Figure 11A:
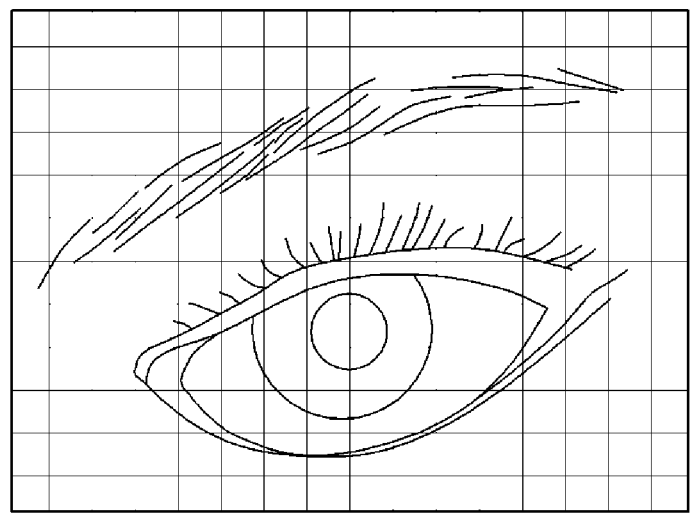
FIGS. 11A and 11B are schematic views illustrating a screen door effect.
Figure 11B:
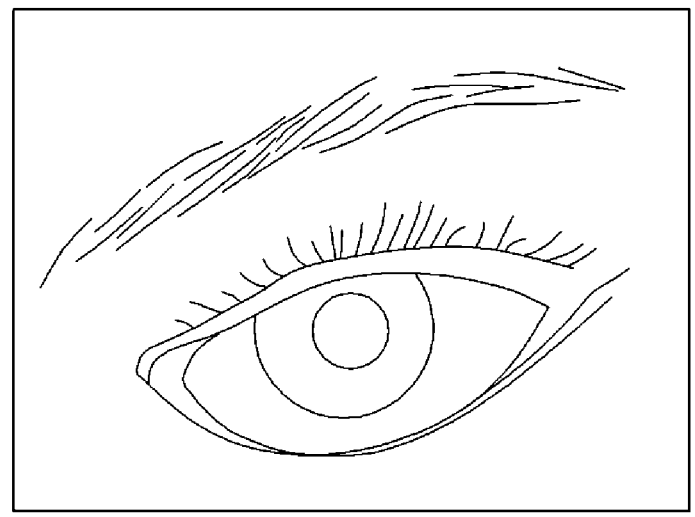

Additionally, since a conventional HMD enlarges an image displayed by a display panel using an eyepiece, a black matrix formed between sub-pixels may also be enlarged and may thus become visible. As a result, referring to FIG. 11A, a screen door effect may occur in related art devices in which the black matrix is viewed as a lattice. According to the example embodiment of FIGS. 5, 6, and 7, since first, second, third, fourth, and fifth view images displayed by the sub-pixels (RP, GP, and BP) are enlarged and displayed in the first, second, third, fourth, and fifth view regions, respectively, by the lenses 310, the screen door effect does not occur, as illustrated in FIG. 11B.

Figure 8:
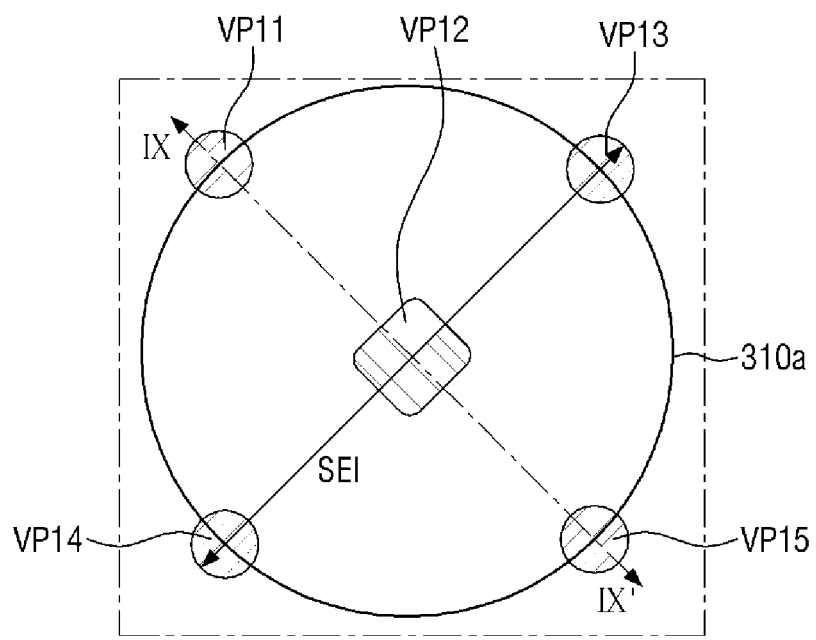
FIG. 8 is an enlarged plan view illustrating sub-pixels overlapping with a first lens of FIG. 4.
Figure 9:
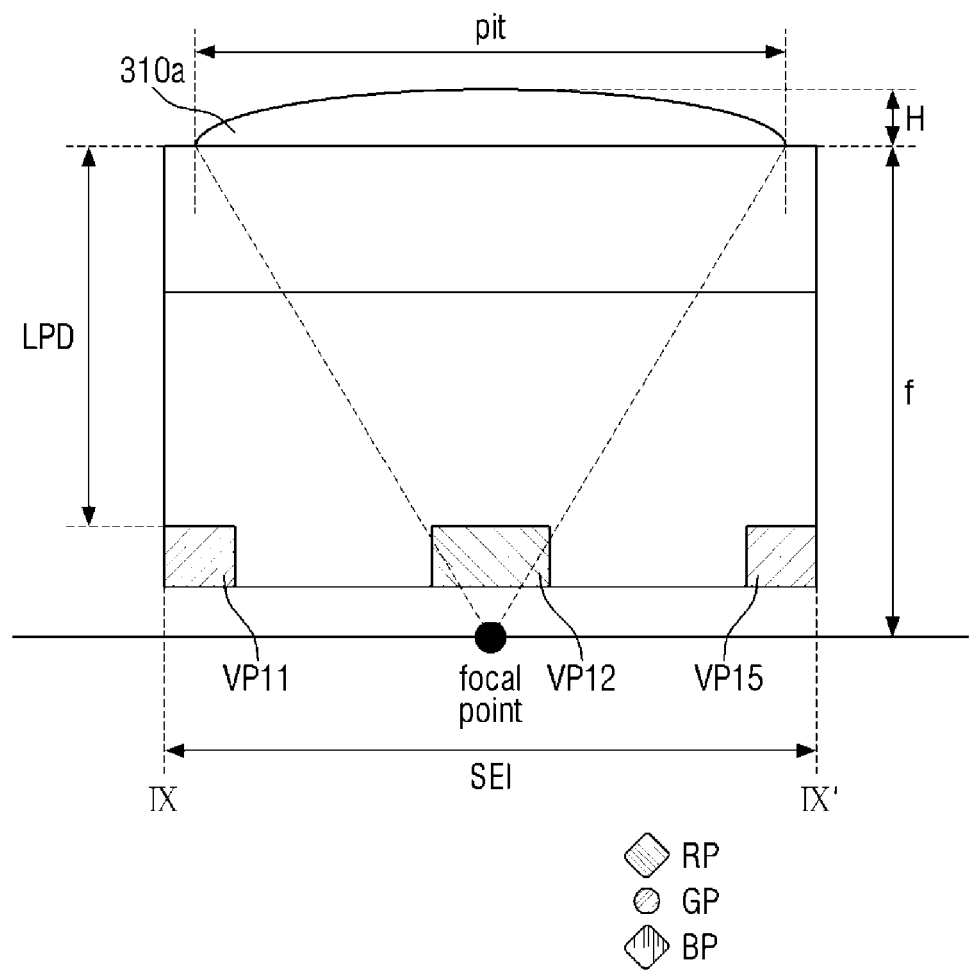
FIG. 9 is a cross-sectional view taken along line IX-IX' of FIG. 8.

FIG. 8 is an enlarged plan view illustrating sub-pixels overlapping with the first lens of FIG. 4. FIG. 9 is a cross-sectional view taken along line IX-IX' of FIG. 8.

Figure 10:
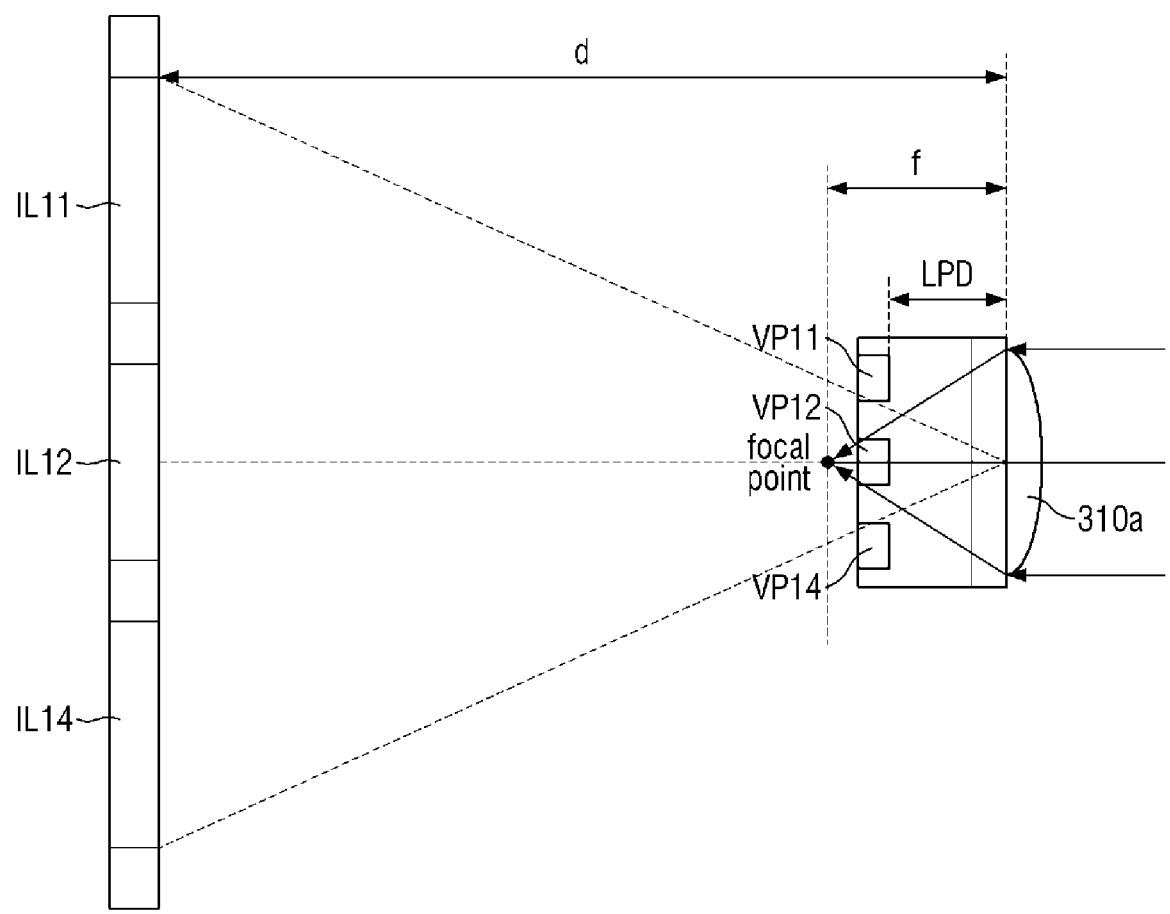
FIG. 10 is a schematic view illustrating how a virtual image can be realized by the sub-pixels and the lenses of a display panel.

Referring to FIGS. 8 and 9, a focal length f of the first lens 310a may be greater than a distance LPD between the first lens 310a and the sub-pixels (RP, GP, and BP). Accordingly, an image displayed by the sub-pixels (RP, GP, and BP) may be enlarged and viewed as a virtual image via the first lens 310a. For example, referring to FIG. 10, a (1-1)-th view pixel VP11 may be enlarged and viewed as a (1-1)-th virtual image IL11, a (1-2)-th view pixel VP12 may be enlarged and viewed as a (1-2)-th virtual image IL12, and a (1-4)-th view pixel VP14 may be enlarged and viewed as a (1-4)-th virtual image IL14.

The focal length f of the first lens 310a may be defined by Equation (1):

$$\frac{1}{f} = \frac{1}{LPD} + \frac{1}{d}$$

where LPD denotes the distance between the first lens 310a and the sub-pixels (RP, GP, and BP), and d denotes the distance between the first lens 310a and a display surface where a virtual image is displayed.

Conditions for realizing a virtual image using the first lens 310a may be as follows. A height H of the first lens 310a may be 3 μm to 10 μm, a pitch "pit" of the first lens 310a may be about 25 μm to "SEI", the curvature of the first lens 310a (K∝1/R where R denotes radius) may be about 5 to about 20, and the distance LPD between the first lens 310a and the sub-pixels (RP, GP, and BP) may be about 200 μm to about 450 μm. Here, "SEI" refers to the maximum distance between the sub-pixels overlapping with the first lens 310a. For example, referring to the sub-pixels overlapping with the first lens 310a, "SEI" may be the maximum distance between a pair of second sub-pixels GP that are symmetrical with each other with respect to a first sub-pixel RP, as illustrated in FIG. 8. That is, "SEI" may be the maximum distance between (1-1)-th and (1-5)-th view pixels VP11 and VP15, which display first and fifth view images, respectively as shown in FIG. 9, or the maximum distance between (1-3)-th and (1-4)-th view pixels VP13 and VP14, which display third and fourth view images, respectively as shown in FIG. 8.

As described above, according to the example embodiment of FIGS. 4 through 9, since the first lens array 300, which includes the lenses 310, is disposed on the first display panel 100a, a plurality of view regions can be provided to a location where the eyes of the user are placed. Thus, a virtual image enlarged from an image displayed by the first display panel 100 can be provided to the user without requiring an eyepiece. Accordingly, according to the example embodiment of FIGS. 4 through 9, an eyepiece can be eliminated from an HMD, and as a result, the thickness of an HMD can be reduced compared to related are display devices including an eyepiece.

The first display panel 100 and the first lens array 300 have been described above with reference to FIGS. 1 through 7. The second display panel 200 and the second lens array 400 may be formed in substantially the same manners as the first display panel 100 and the first lens array 300, and thus, detailed descriptions thereof will be omitted. Also, the first lens 310a of each of the lenses 310 and the sub-pixels overlapping with the first lens 310a of each of the lenses 310 have been described with reference to FIGS. 8 through 10. The second, third, and fourth lenses 310b, 310c, and 310d of each of the lenses 310 and the sub-pixels overlapping with each of the second, third, and fourth lenses 310b, 310c, and 310d of each of the lenses 310 may be designed in substantially the same manners as the first lens 310a of each of the lenses 310 and the sub-pixels overlapping with the first lens 310a of each of the lenses 310, and thus, detailed descriptions thereof will be omitted.

Figure 12:
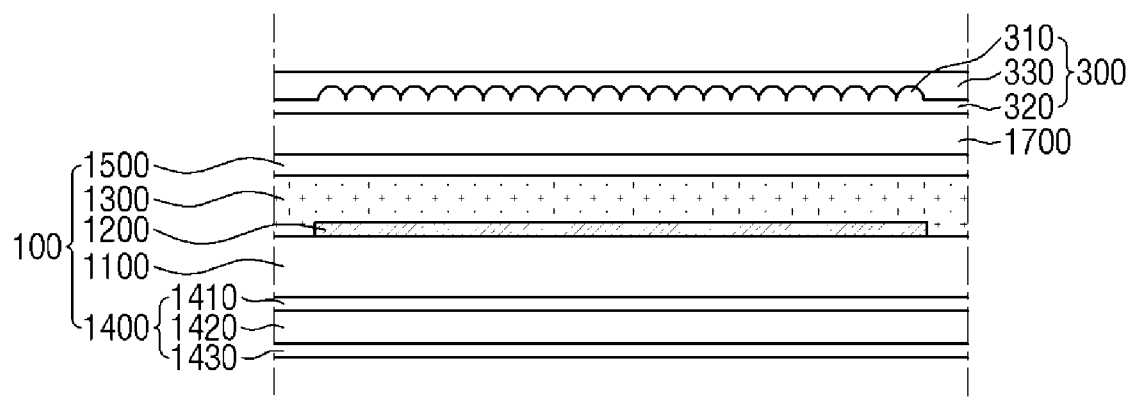
FIG. 12 is a side view illustrating the first lens array and the first display panel of the display device of FIG. 1.

FIG. 12 is a side view illustrating the first lens array 300 and the first display panel 100 of the display device 10 of FIG. 1.

Referring to FIG. 12, the first display panel 100 may include a substrate 1100, a pixel array layer 1200, a thin-film encapsulation layer 1300, a panel bottom member 1400, and a polarizing film 1500.

The substrate 1100 may be formed of glass or plastic. In an embodiment where the substrate 1100 is formed of plastic, the substrate 1100 may be formed of polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof.

The pixel array layer 1200 is disposed on the substrate 1100. The pixel array layer 1200 is a layer in which the pixels P are formed to display an image. The pixel array layer 1200 may include a thin-film transistor (TFT) layer and a light-emitting element layer.

The thin-film encapsulation layer 1300 is disposed on the pixel array layer 1200. The thin-film encapsulation layer 1300 prevents oxygen or moisture from infiltrating into the pixel array layer 1200. To this end, the thin-film encapsulation layer 1300 may include at least one inorganic film and at least one organic film.

The pixel array layer 1200 and the thin-film encapsulation layer 1300 will be described later with reference to FIG. 14.

The panel bottom member 1400 is disposed below the substrate 1100. The panel bottom member 1400 may include at least one of a heat dissipation layer for efficiently releasing heat from the first display panel 100, an electromagnetic wave shielding layer for shielding electromagnetic waves, a light shielding layer for shielding light incident from the outside, a light absorbing layer for absorbing light, and a buffer layer for absorbing external shocks. For example, as illustrated in FIG. 12, the panel bottom member 1400 may include a light absorbing member 1410, a buffer member 1420, and a heat dissipation member 1430.

The light absorbing member 1410 may be disposed below the substrate 1100. The light absorbing member 1410 blocks the transmission of light and thus prevents the elements disposed therebelow from becoming visible from above the first display panel 100. The light absorbing member 1410 may include a light absorbing material such as a black pigment or dye.

The buffer member 1420 may be disposed below the light absorbing member 1410. The buffer member 1420 absorbs external shocks and thus prevents the first display panel 100 from being damaged. The buffer member 1420 may be formed as a single- or multilayer film. For example, the buffer member 1420 may be formed of a polymer resin such as polyurethane, polycarbonate, polypropylene, or polyethylene or may include an elastic material such as a sponge obtained by foam-molding rubber, a urethane material, or an acrylic material. The buffer member 1420 may be a cushion layer.

The heat dissipation member 1430 may be disposed below the buffer member 1420. The heat dissipation member 1430 may include at least one heat dissipation layer. For example, the heat dissipation member 1430 may include a first heat dissipation layer including graphite or carbon nanotubes or a second heat dissipation layer including a film of a metal with excellent thermal conductivity such as copper, nickel, ferrite, or silver.

The polarizing film 1500 may be disposed on the thin-film encapsulation layer 1300. The polarizing film 1500 prevents external light from being reflected by the metal wires or electrodes of the pixel array layer 1200 to become visible to the user.

The first lens array 300 may include the lenses 310, a lens substrate 320, and a lens planarization film 330.

The lenses 310 may be formed on the top surface of the lens substrate 320. Since the lenses 310 are formed by removing parts of the lens substrate 320, the lenses 310 and the lens substrate 320 may be formed in one integral body. Also, the lenses 310 and the lens substrate 320 may be formed of the same material.

The lens planarization film 330 is formed on the lenses 310 and planarizes height differences formed between the lenses 310. In order to improve the refraction effect of the lenses 310, the difference between the refractive index of the lenses 310 and the refractive index of the lens planarization film 330 may be about 0.3 or greater. The lens planarization film 330 may be formed as an organic film having a refractive index of about 1.4 or less.

The gap maintaining member 1700 may be disposed between the first display panel 100 and the first lens array 300 to maintain a predetermined distance LPD between the first array 300 and the pixel array layer 1200 where the pixels P of the first display panel 100 are formed. In order to raise the percentage of light from the pixels P of the first display panel 100 arriving at the first lens array 300, the gap maintaining member 1700 may be formed of a material having a similar refractive index to the refractive index of the thin-film encapsulation layer 1300 of the first display panel 100 and to the refractive index of the lenses 310 or the lens substrate 320 of the first lens array 300. For example, the difference between the refractive index of the gap maintaining member 1700 and the refractive index of the thin-film encapsulation layer 1300 of the first display panel 100 and between the refractive index of the gap maintaining member 1700 and the refractive index of the lenses 310 or the lens substrate 320 of the first lens array 300 may be about 0.1 or less.

In one example embodiment, referring to FIG. 13, the gap maintaining member 1700 may include a plastic substrate 1710, an adhesive layer 1720 disposed on a first surface of the plastic substrate 1710, and a protective film 1730 disposed on a second surface of the plastic substrate 1710. The first and second surfaces of the plastic substrate 1710 may be opposite to each other. In order for gap maintaining member 1700 to properly maintain a gap, the plastic substrate 1710 may be formed to a thickness of about 100 μm to about 300 μm. The plastic substrate 1710 may be formed of polyethylene terephthalate, polycarbonate, or poly(methyl methacrylate) (PMMA). The adhesive layer 1720 may be a silicon-based transparent adhesive layer having chemical resistance to poly(glycidyl methacrylate) (PGMA). The adhesive layer 1720 bonds the plastic substrate 1710 and the thin-film encapsulation layer 1300 together.

In another example embodiment, the gap maintaining member 1700 may be formed of a ultraviolet (UV)-curable resin. In this example embodiment, the gap maintaining member 1700 may be formed by applying a resin on the first display panel 100 through slit coating or inkjet printing and UV-curing the resin.

The first display panel 100 and the first lens array 300 have been described above with reference to FIG. 12. The second display panel 200 and the second lens array 400 may be substantially the same as the first display panel 100 and the first lens array 300, respectively, and thus, detailed descriptions thereof will be omitted.

Figure 14:
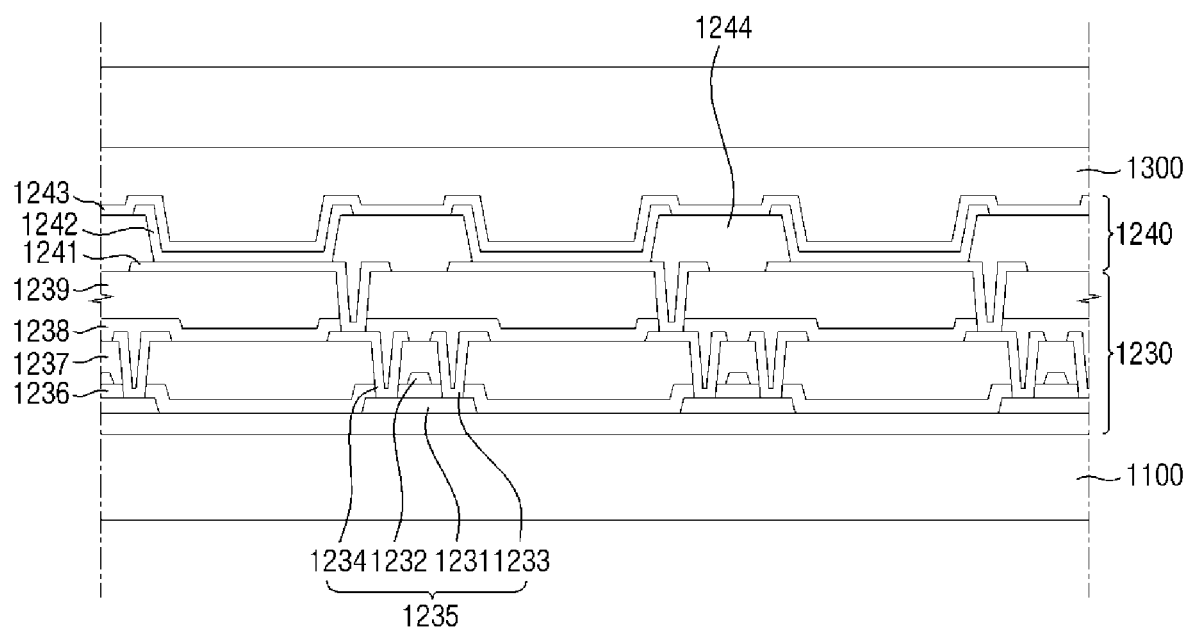
FIG. 14 is a cross-sectional view illustrating a substrate, a pixel array layer, and a thin-film encapsulation layer of FIG. 12.

FIG. 14 is a cross-sectional view illustrating the substrate, the pixel array layer, and the thin-film encapsulation layer of FIG. 12.

Referring to FIG. 14, a TFT layer 1230 is formed on the substrate 1100. The TFT layer 1230 includes TFTS 1235, a gate insulating film 1236, an interlayer insulating film 1237, a passivation film 1238, and a planarization film 1239.

A buffer film may be formed on the substrate 1100. The buffer film may be formed on the substrate 1100 to protect the TFTs 1235 and light-emitting elements against moisture. The buffer film may include a plurality of inorganic films that are alternately stacked. For example, the buffer film may be formed as a multilayer film in which at least one of a silicon oxide (SiOx) film, a silicon nitride (SiNx) film, and a silicon oxynitride (SiON) film is alternately stacked. In one or more embodiments, the buffer film may not be provided.

The TFTs 1235 are formed on the buffer film. The TFTs 1235 include active layers 1231, gate electrodes 1232, source electrodes 1233, and drain electrodes 1234. FIG. 14 illustrates an example in which the TFTs 1235 are top gate TFTs in which the gate electrodes 1232 are disposed above the active layers 1231, but the present disclosure is not limited thereto. That is, the TFTs 1235 may be bottom gate TFTs in which the gate electrodes 1232 are disposed below the active layers 1231 or may be double gate TFTs in which the gate electrodes 1232 are disposed above and below the active layers 1231.

The active layers 1231 are formed on the buffer film. The active layers 1231 may be formed of a silicon-based semiconductor material or an oxide-based semiconductor material. A light shielding layer for blocking external light incident upon the active layers 1231 may be formed between the buffer film and the active layers 1231.

The gate insulating film 1236 may be formed on the active layers 1231. The gate insulating film 1216 may be formed as an inorganic film such as a silicon oxide film, a silicon nitride film, or a multilayer film thereof.

The gate electrodes 1232 and gate lines may be formed on the gate insulating film 1216. The gate electrodes 1232 and the gate lines may be formed as single- or multilayer films including molybdenum (Mo), aluminum (Al), chromium (Cr), gold (Au), titanium (Ti), nickel (Ni), neodymium (Nd), copper (Cu), or an alloy thereof.

The interlayer insulating film 1237 may be formed on the gate electrodes 1232 and the gate lines. The interlayer insulating film 1237 may be formed as an inorganic film such as a silicon oxide film, a silicon nitride film, or a multilayer film thereof.

The source electrodes 1233, the drain electrodes 1234, and data lines may be formed on the interlayer insulating film 1237. The source electrodes 1233 and the drain electrodes 1234 may be connected to the active layers 1231 via contact holes that penetrate the gate insulating film 1236 and the interlayer insulating film 1237. The source electrodes 1233, the drain electrodes 1234, and the data lines may be formed as single- or multilayer films including molybdenum, aluminum, chromium, gold, titanium, nickel, neodymium, copper, or an alloy thereof.

The passivation film 1238 may be formed on the source electrodes 1233, the drain electrodes 1234, and the data lines. The passivation film 1238 may be formed as an inorganic film such as a silicon oxide film, a silicon nitride film, or a multilayer film thereof.

The planarization film 1239 may be formed on the passivation film 1238 to planarize height differences formed by the TFTs 1235. The planarization film 1239 may be formed as an organic film including an acrylic resin, an epoxy resin, a phenolic resin, a polyamide resin, or a polyimide resin.

A light-emitting element layer 1240 is formed on the TFT layer 1230. The light-emitting element layer 1240 includes light-emitting elements and pixel defining films 1244.

The light-emitting elements and the pixel defining films 1244 are formed on the planarization film 1239. The light-emitting elements may be OLEDs. In this case, the light-emitting elements 1239 may include anode electrodes 1241, light-emitting layers 1242, and cathode electrodes 1243.

The anode electrodes 1241 may be formed on the planarization film 1239. The anode electrodes 1241 may be connected to the source electrodes 1233 of the TFTs 1235 via contact holes that penetrate the passivation film 1238 and the planarization film 1239.

The pixel defining films 1244 may be formed on the planarization film 1239 to cover the edges of each of the anode electrodes 1241 and thus to define pixels. That is, the pixel defining films 1244 may define pixels. The pixels refer to regions in which the anode electrodes 1241, the light-emitting layers 1242, and the cathode electrodes 1243 are sequentially stacked and holes from the anode electrodes 1241 and electrons from the cathode electrodes 1243 combine together in the light-emitting layer 1242 to emit light.

The light-emitting elements 1242 are formed on the anode electrodes 1241 and the pixel defining films 1244. The light-emitting elements 1242 may be organic light-emitting layers. The light-emitting layers 1242 may emit one of red light, green light, and blue light. The peak wavelength of the red light may range from about 620 nm to about 750 nm, the peak wavelength of the green light may range from about 495 nm to about 570 nm, and the peak wavelength of the blue light may range from about 450 nm to about 495 nm. The light-emitting layers 1242 may be a white light-emitting layer emitting white light. In one such embodiment, the light-emitting layers 1242 may have a stack of red, green, and blue light-emitting layers and may be a common layer formed commonly for all pixels. Also, in such an embodiment, the first display panel 100 may further include color filters for displaying red, green, and blue colors.

The light-emitting layers 1242 may include hole transport layers, emission layers, and electron transport layers. The light-emitting layers 1242 may have a tandem structure with two or more stacks, in which case, a charge generating layer may be formed between the stacks.

The cathode electrodes 1243 may be formed on the light-emitting layers 1242. The cathode electrodes 1243 may be formed to cover the light-emitting layers 1242. The cathode electrodes 1243 may be a common layer formed commonly for all pixels.

In a case where the light-emitting element layers 304 is formed as a top emission-type light-emitting element layer, the anode electrodes 1241 may be formed of a metal material with high reflectance such as a stack of aluminum and titanium (e.g., Ti/Al/Ti), a stack of aluminum and ITO (e.g., ITO/Al/ITO), a silver (Ag)-palladium (Pd)-copper (Cu) (APC) alloy, or a stack of an APC alloy and ITO (e.g., ITO/APC/ITO), and the cathode electrodes 1243 may be formed of a transparent conductive oxide (TCO) material such as ITO or IZO that can transmit light therethrough or a semi-transmissive conductive material such as magnesium (Mg), silver, or an alloy thereof. In a case where the cathode electrodes 1243 are formed of a semi-transmissive conductive material, the emission efficiency of the light-emitting element layer 1240 may be improved due to a micro-cavity effect.

In an embodiment where the light-emitting element layer 1240 is formed as a bottom emission-type light-emitting element layer, the anode electrodes 1241 may be formed of a TCO material such as ITO or IZO or a semi-transmissive conductive material such as magnesium, silver, or an alloy thereof, and the cathode electrodes 1243 may be formed of a metal material with high reflectance such as a stack of aluminum and titanium (e.g., Ti/Al/Ti), a stack of aluminum and ITO (e.g., ITO/Al/ITO), an APC alloy, or a stack of an APC alloy and ITO (e.g., ITO/APC/ITO). In an embodiment where the anode electrodes 1241 are formed of a semi-transmissive conductive material, the emission efficiency of the light-emitting element layer 1240 may be improved due to a micro-cavity effect.

The thin-film encapsulation layer 1300 is formed on the light-emitting element layer 1240. The thin-film encapsulation layer 1300 prevents the penetration of oxygen or moisture into the light-emitting layers 1242 and the cathode electrodes 1243. The thin-film encapsulation layer 1300 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide. The thin-film encapsulation layer 1300 may further include at least one organic film. The organic layer may be formed to a sufficient thickness to prevent particles from entering the light-emitting layers 1242 and the cathode electrodes 1243 through the thin-film encapsulation layer 1300. The organic film may include one of epoxy, acrylate, and urethane acrylate.

Figure 15:
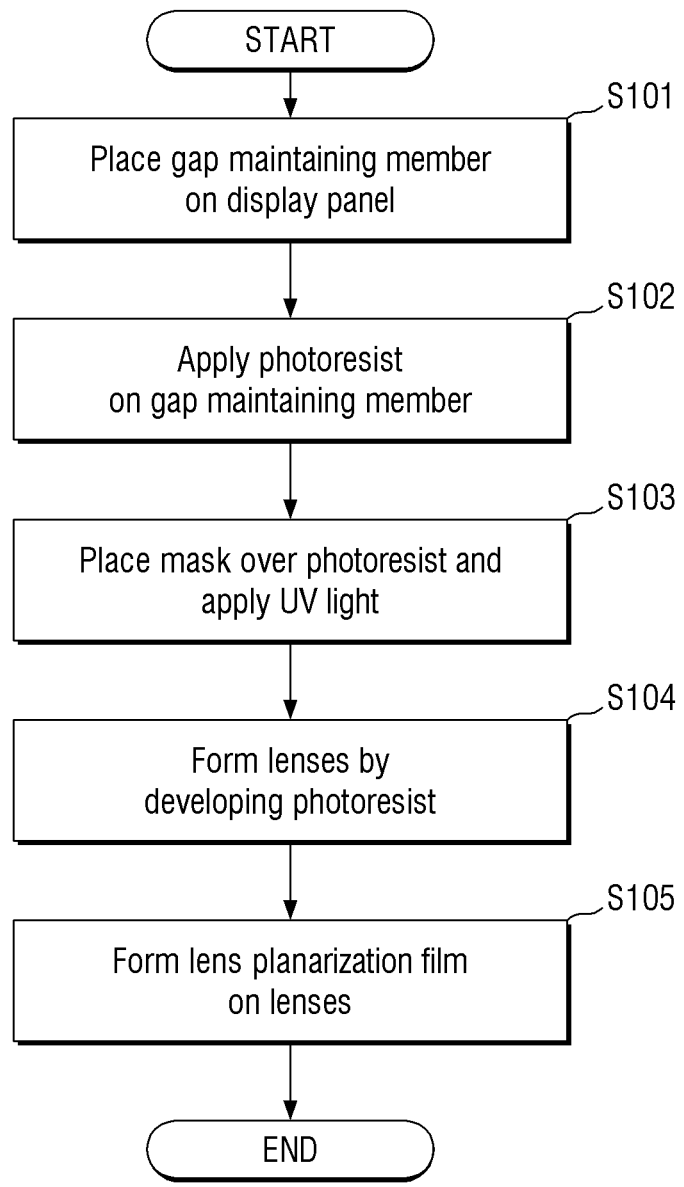
FIG. 15 is a flowchart illustrating a method of manufacturing a lens array-integrated display panel according to an example embodiment of the present disclosure.

FIG. 15 is a flowchart illustrating a method of manufacturing a lens array-integrated display panel according to an example embodiment of the present disclosure. FIGS. 16 through 20 are side views illustrating the method of manufacturing a lens array-integrated display panel according to an example embodiment of the present disclosure.

A method to fabricate a lens array-integrated display panel in which the first lens array 300 is formed on the first display panel 100 will hereinafter be described with reference to FIGS. 15 through 20.

Figure 16:
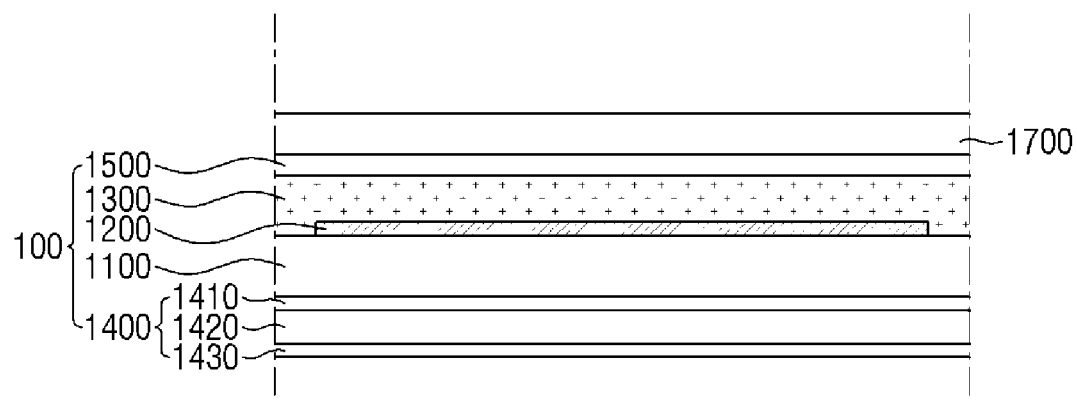
FIGS. 16 through 20 are side views illustrating the method of manufacturing a lens array-integrated display panel according to an example embodiment of the present disclosure.

Referring to FIG. 16, the gap maintaining member 1700 is placed on the first display panel 100 (task S101 of FIG. 15).

For example, in an embodiment where the gap maintaining member 1700 includes a plastic substrate and an adhesive layer, the gap maintaining member 1700 may be attached on the first display panel 100 through lamination. In one or more embodiments, the gap maintaining member 1700 may be placed on the thin-film encapsulation layer 1300 of the first display panel 100 and may be pressurized and/or heated to be attached on the thin-film encapsulation layer 1300 of the first display panel 100.

In another example embodiment in which the gap maintaining member 1700 is formed of a UV-curable resin, the UV-curable resin may be applied on the thin-film encapsulation layer 1300 of the first display panel 100 and may be UV-cured, thereby forming the gap maintaining member 1700. The UV-curable resin may be applied via slit coating or inkjet printing.

In order to raise the percentage of light from the pixels P of the first display panel 100 arriving at the first lens array 300, the gap maintaining member 1700 may be formed of a material having a similar refractive index to the refractive index of the thin-film encapsulation layer 1300 of the first display panel 100.

Figure 17:
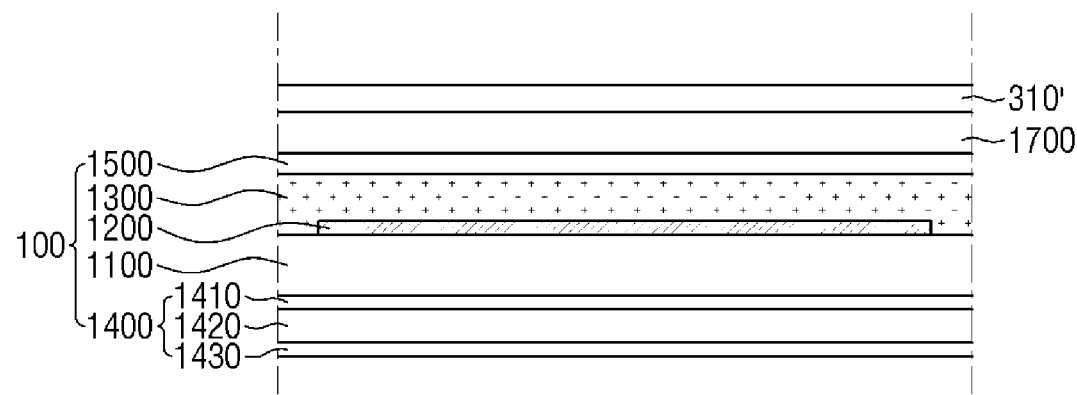

Thereafter, referring to FIG. 17, photoresist 320 is applied on the gap maintaining member 1700 (task S102 of FIG. 15).

The photoresist 320' may preferably be of a negative type so that parts not irradiated with UV can be removed by a development process and parts irradiated with UV can remain unremoved. Also, in one or more embodiments, the photoresist 320' may be an organic film having a refractive index of about 1.5 or greater in consideration of the lens planarization film 330.

Figure 21A:
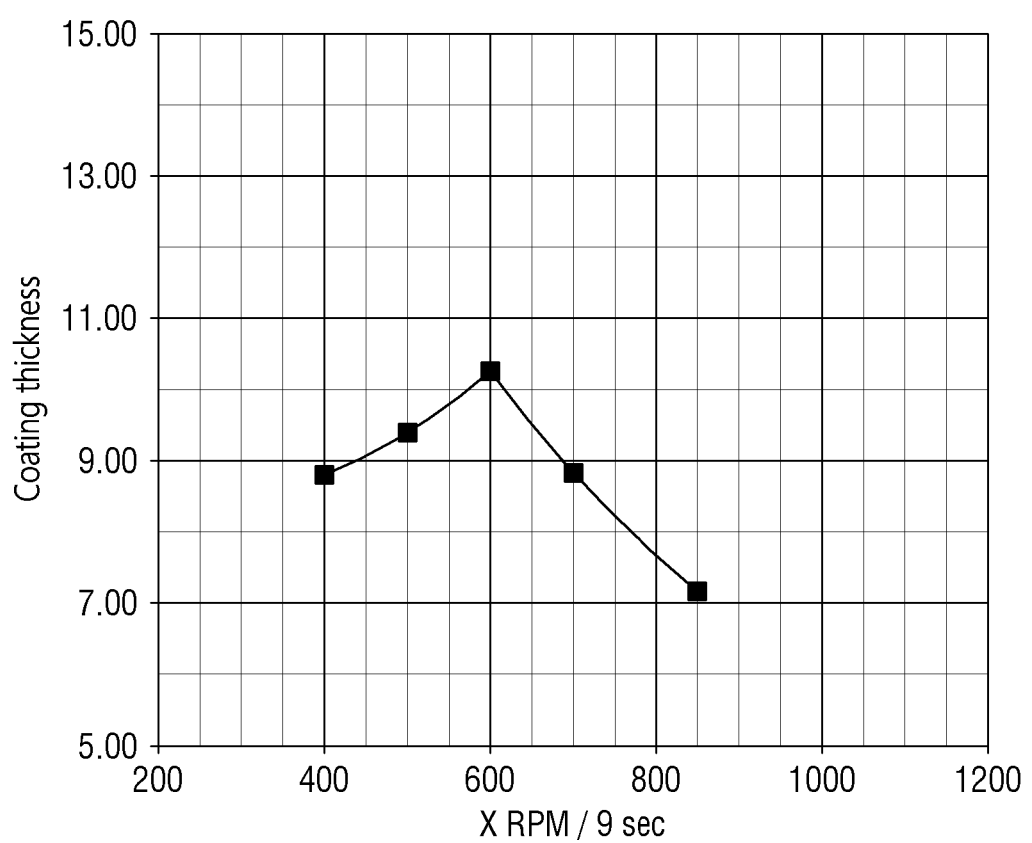
FIGS. 21A and 21B are graphs showing the thicknesses of photoresist for different spin coating speeds.
Figure 21B:
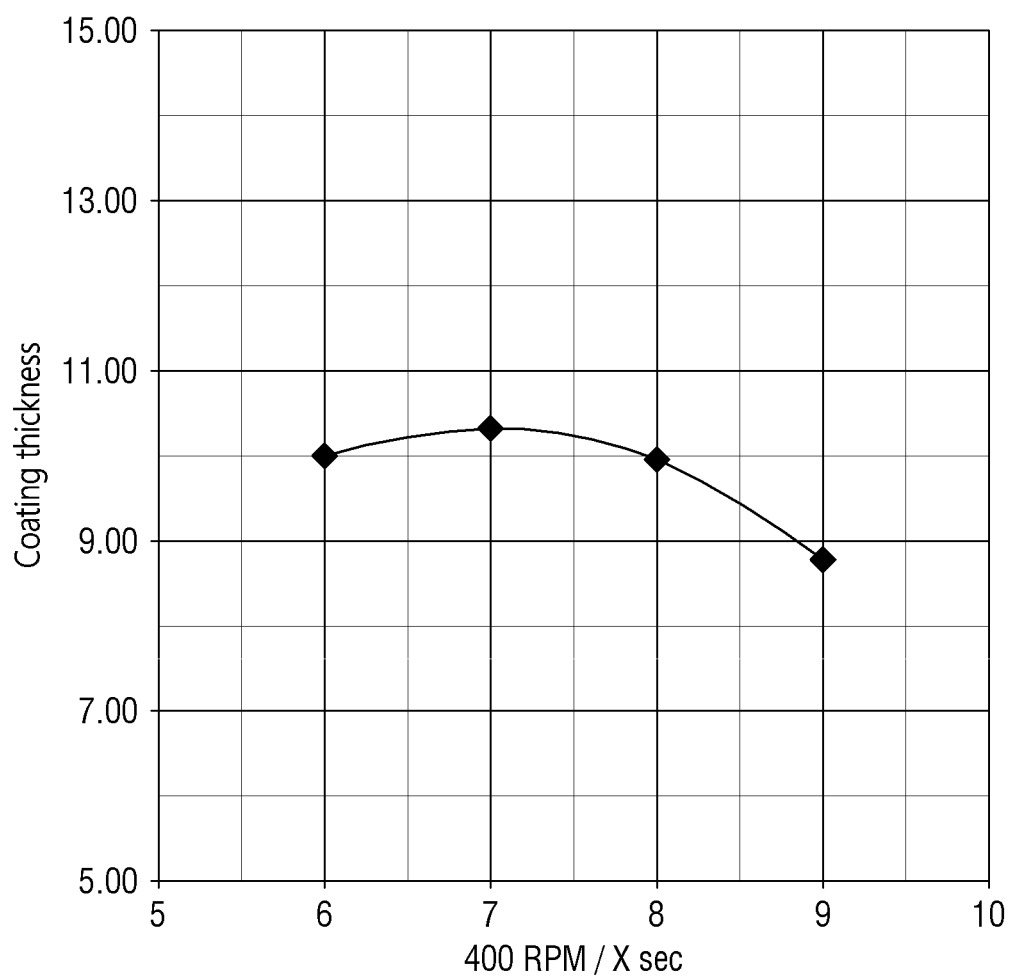

The photoresist 320' may include a resin and photoacrylate (PAC) and may be formed by spin coating. Referring to the embodiment illustrated FIG. 21A, the photoresist 320' may be applied on the gap maintaining member 1700 to a thickness of about 10 μm by spinning the first display panel 100 with the gap maintaining member 1700 disposed thereon at a speed of 600 RPM for about nine seconds. Alternatively, referring to the embodiment illustrated in FIG. 21B, the photoresist 320' may be coated on the gap maintaining member 1700 to a thickness of about 10 μm by spinning the first display panel 100 with the gap maintaining member 1700 disposed thereon at a speed of 400 RPM for about seven seconds.

Figure 18:
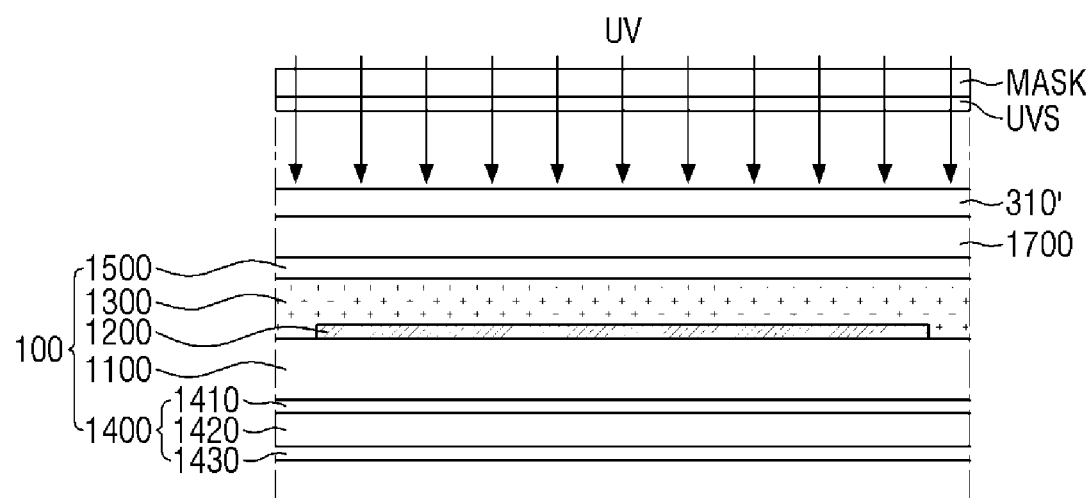

Thereafter, referring to FIG. 18, a mask M is placed on the photoresist 320', and UV light is applied to the photoresist 320' (task S103 of FIG. 15).

As illustrated in FIG. 18, the mask M includes a UV blocking member UVS. The thicker the UV blocking member UVS is, the less UV the UV blocking member UVS transmits therethrough. Thus, as shown in FIG. 22, the thickness of the UV blocking member UVS may become greater from the center to the edges of each of the lenses 310.

Figure 19:
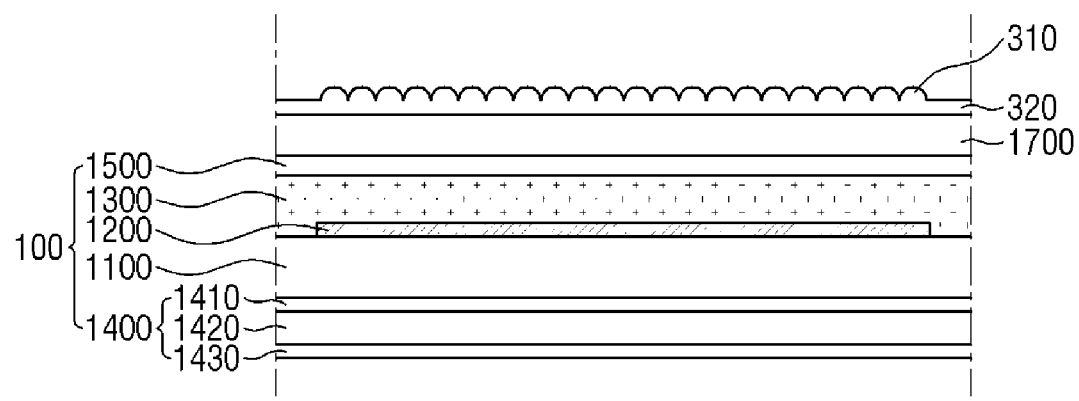

Thereafter, referring to FIG. 19, the lenses 310 are formed by developing the photoresist 320' (task S104 of FIG. 15).

Figure 22:
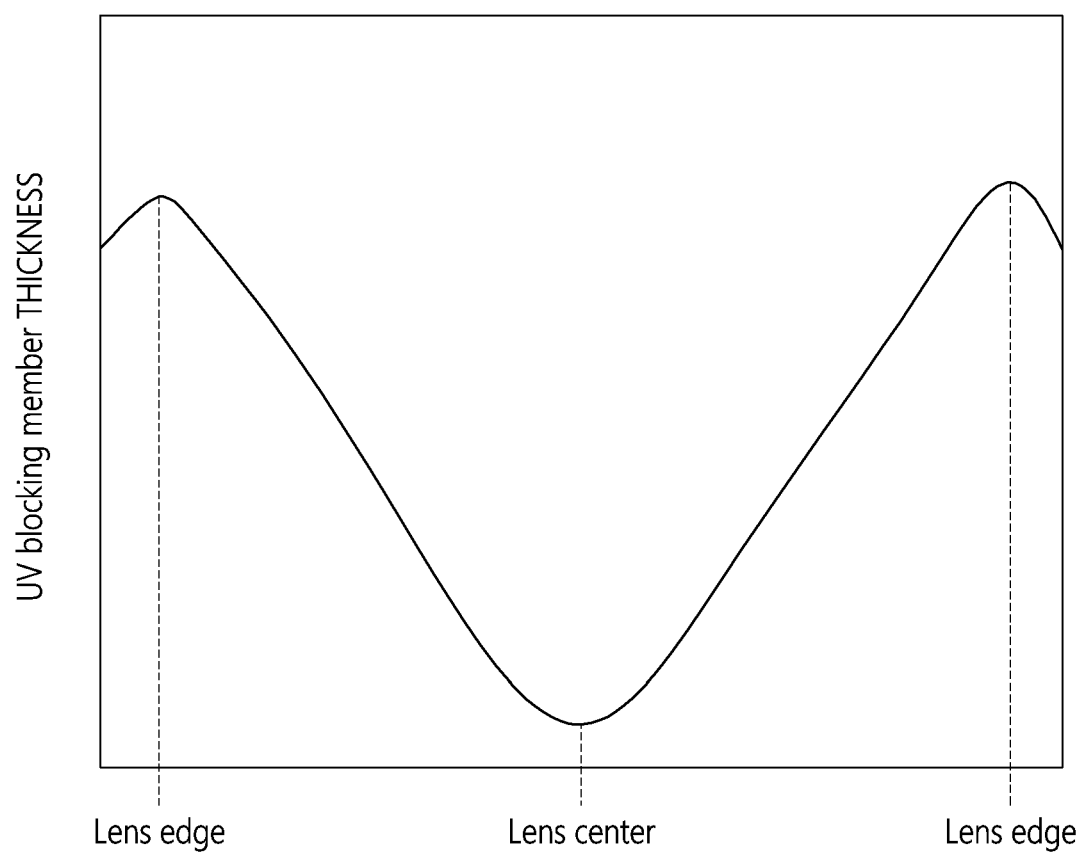
FIG. 22 is a graph showing ultraviolet (UV) transmittances for different UV blocking member thicknesses.

Since the UV blocking member UVS becomes thicker from the center to the edges of each of the lenses 310, as shown in the embodiment of FIG. 22, the center of each of the lenses 310 is irradiated with the greatest amount of UV light, and the edges of each of the lenses 310 is irradiated with the least amount of UV light. Since the photoresist 320' is a negative photoresist, the photoresist 320' is removed the most from areas irradiated with the least amount of UV light, and the least from areas irradiated with the greatest amount of UV light. As a result, the lenses 310 can be formed by developing the photoresist 320'.

Thereafter, the lenses 310 may be thermally treated to smooth the slope of the lenses 310. In order to prevent the pixel array layer 1200 of the first display panel 100 from being damaged, the lenses 310 may be thermally treated at a temperature of about 100° C. or lower for less than about 10 minutes.

Figure 20:
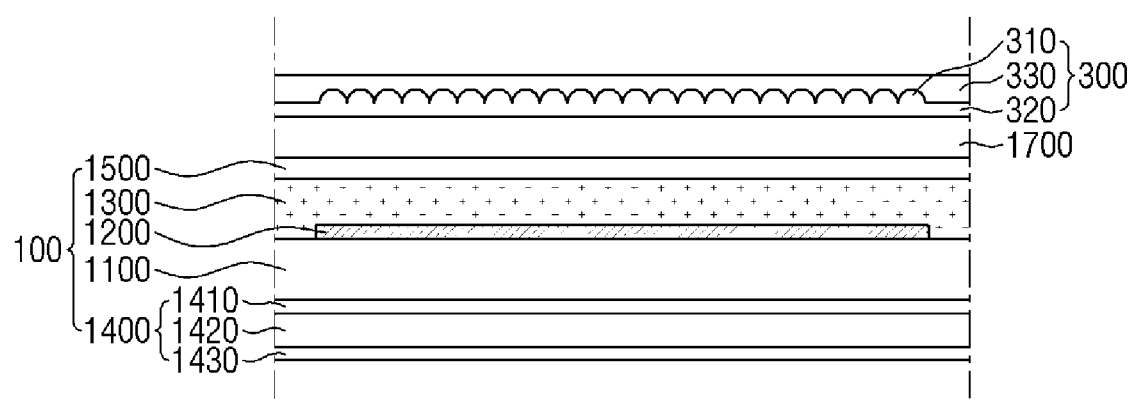

Thereafter, referring to FIG. 20, the lens planarization film 330 is formed on the lenses 310 (task S105 of FIG. 15). The lens planarization film 330 planarizes height differences formed between the lenses 310.

The lens planarization film 330 may be formed as an organic film. In order to improve the refraction effect of the lenses 310, the difference between the refractive index of the lenses 310 and the refractive index of the lens planarization film 330 may be about 0.3 or greater. Accordingly, when the refractive index of the lenses 310 is about 1.7, the refractive index of the lens planarization film 330 may be about 1.4. Also, when the refractive index of the lenses 310 is about 1.5, the lens planarization film 330 may not be provided because it is difficult to form an organic film having a refractive index of 1.2 or less as the lens planarization film 330. In this case, since the top surfaces of the lenses 310 are in contact with the air having a refractive index of 1.0, the lenses 310 can have a sufficient refraction effect.

Figure 23:
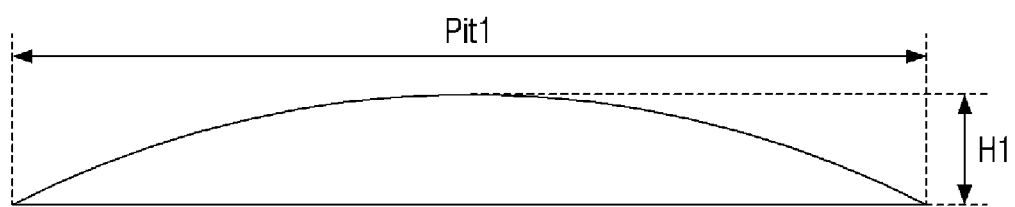
FIG. 23 is a side view illustrating a lens of a first lens array having no lens planarization film.
Figure 24:
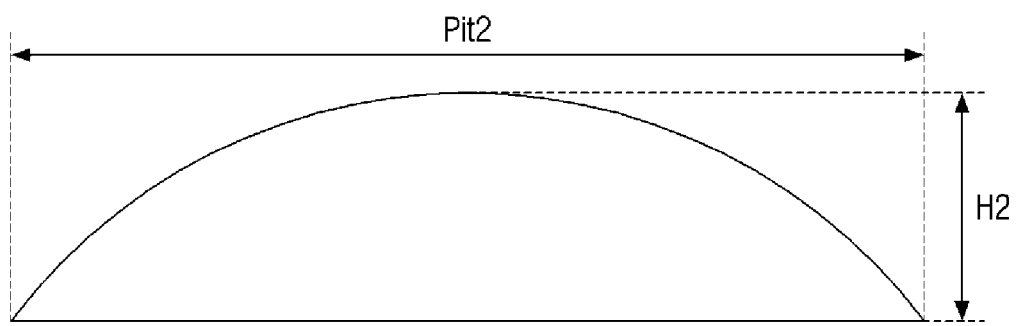
FIG. 24 is a side view illustrating a lens of a first lens array having a lens planarization film.

The material and the design of the lenses 310 may vary depending on the refractive index of the lenses 310. For example, referring to FIG. 23, when the refractive index of the lenses 310 is about 1.7, the ratio of a pitch Pit1 of the lenses 310 to a height H1 of the lenses 310 may be about 6.5:1, and the height H1 of the lenses 310 may preferably be about 10 μm. Alternatively, referring to FIG. 24, when the refractive index of the lenses 310 is about 1.5, the ratio of a pitch Pit2 of the lenses 310 to a height H2 of the lenses 310 may be about 16.6:1, and the height H2 of the lenses 310 may preferably be about 4 μm.

Additionally, when the first lens array 300 including the lenses 310 is bonded to the first display panel 100, the lenses 310 may not be properly aligned with the sub-pixels (RP, GP, and BP) of the first display panel 100. Due to alignment error between the lenses 310 and the sub-pixels (RP, GP, and BP), view regions may be shifted so that view images may be blurred or some of the view images may not be properly viewed. However, according to the example embodiment of FIG. 15, since the first lens array 300 including the lenses 310 is formed directly on the first display panel 100, alignment error between the lenses 310 and the sub-pixels (RP, GP, and BP) can be reduced compared to related art display devices. In the example embodiment of FIG. 15, the lenses 310 are formed by a photolithography process, and the photolithography process has a process error of about 5 μm, which is smaller than alignment error between the lenses 310 and the sub-pixels (RP, GP, and BP).

A lens array-integrated display panel in which the second lens array 400 is formed on the second display panel 200 is formed in substantially the same manner as the lens array-integrated display panel described above with reference to FIGS. 15 through 20, and thus, a detailed description thereof will be omitted.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A display device comprising:
   a display panel including a plurality of pixels, each pixel of the plurality of pixels including N sub-pixels, where N is an integer of 2 or greater; and
   a lens array on a surface of the display panel, the lens array including a plurality of lenses,
   wherein:
   each lens of the plurality of lenses overlaps with M sub-pixels, where M is an integer greater than N,
   each pixel of the plurality of pixels includes a first sub-pixel configured to display a first color, a second sub-pixel configured to display a second color, and a third sub-pixel configured to display a third color,
   the lens array includes a first lens, a second lens, a third lens, and a fourth lens, the first lens overlaps with a first sub-pixel and a plurality of second sub-pixels,
the second lens overlaps with a plurality of first sub-pixels, a second sub-pixel, and a plurality of third sub-pixels,
the third lens overlaps with a plurality of second sub-pixels and a third sub-pixel, and
the fourth lens overlaps with a plurality of first sub-pixels, a second sub-pixel, and a plurality of third sub-pixels.

2. The display device of claim 1, wherein among the first sub-pixel and the plurality of second sub-pixels overlapping with the first lens, the first sub-pixel and a first pair second sub-pixels of the plurality of second sub-pixels are arranged in parallel to one another in a first direction, and the first sub-pixel and a second pair of second sub-pixels of the plurality of second sub-pixels are arranged in parallel to one another in a second direction that intersects the first direction.

3. The display device of claim 2, wherein:
the first pair of second sub-pixels are symmetrical with each other with respect to the first sub-pixel, and
the second pair of second sub-pixels are symmetrical with each other with respect to the first sub-pixel.

4. The display device of claim 2, wherein:
one of the first pair of second sub-pixels is configured to display a first view image,
the other of the first pair of second sub-pixels is configured to display a fifth view image,
the first sub-pixel is configured to display a second view image,
one of the second pair of second sub-pixels is configured to display a third view image, and
the other of the second pair of second sub-pixels is configured to display a fourth view image.

5. The display device of claim 4, wherein the first, second, third, fourth, and fifth view images are provided to first, second, third, fourth, and fifth view regions, respectively, by the first lens.

6. The display device of claim 5, wherein a maximum distance between a pair of adjacent view images among the first, second, third, fourth, and fifth view images is about 3 mm or less.

7. The display device of claim 2, wherein a maximum distance between the first pair of second sub-pixels or between the second pair of second sub-pixels is smaller than a pitch of the first lens.

8. The display device of claim 1, wherein among the plurality of first sub-pixels, the second sub-pixel, and the plurality of third sub-pixels overlapping with the second lens or the fourth lens, the second sub-pixel and the plurality of third sub-pixels are arranged in parallel to one another, and the plurality of first sub-pixels and the second sub-pixel are arranged in parallel to one another.

9. The display device of claim 8, wherein:
the plurality of first sub-pixels are symmetrical with each other with respect to the second sub-pixel, and
the plurality of third sub-pixels are symmetrical with each other with respect to the second sub-pixel.

10. The display device of claim 8, wherein among the plurality of first sub-pixels, the second sub-pixel, and the plurality of third sub-pixels overlapping with the second lens, one of the plurality of first sub-pixels is configured to display a first view image, another of the plurality of first sub-pixels is configured to display a fifth view image, the second sub-pixel is configured to display a second view image, one of the plurality of third sub-pixels is configured to display a third view image, and another of the plurality of third sub-pixels is configured to display a fourth view image.

11. The display device of claim 8, wherein among the plurality of first sub-pixels, the second sub-pixel, and the plurality of third sub-pixels overlapping with the fourth lens, one of the third sub-pixels is configured to display a first view image, another of the plurality of third sub-pixel is configured to display a fifth view image, the second sub-pixel is configured to display a second view image, one of the plurality of first sub-pixels is configured to display a third view image, and another of the plurality of first sub-pixel is configured to display a fourth view image.

12. The display device of claim 1, wherein among the plurality of second sub-pixels and the third sub-pixel overlapping with the third lens, the third sub-pixel and a first pair of second sub-pixels of the plurality of second sub-pixels are arranged in parallel to one another in a first direction, and the third sub-pixel and a second pair of second sub-pixels of the plurality of second sub-pixels are arranged in parallel to one another in a second direction that intersects the first direction.

13. The display device of claim 12, wherein:
the first pair of second sub-pixels are symmetrical with each other with respect to the third sub-pixel, and
the second pair of second sub-pixels are symmetrical with each other with respect to the third sub-pixel.

14. The display device of claim 12, wherein:
one second sub-pixel of the first pair of second sub-pixels is configured to display a first view image,
the other second sub-pixel of the first pair of second sub-pixels is configured to display a fifth view image,
the third sub-pixel is configured to display a second view image,
one second sub-pixel of the second pair of second sub-pixels is configured to display a third view image, and
the other second sub-pixel of the second pair of second sub-pixels is configured to display a fourth view image.

15. The display device of claim 1, further comprising:
a gap maintaining member between the display panel and the lens array,
wherein the lens array further includes a lens planarization film covering the plurality of lenses, and
wherein a difference between a refractive index of the plurality of lenses and a refractive index of the lens planarization film is greater than a difference between the refractive index of the plurality of lenses and a refractive index of the gap maintaining member.

16. The display device of claim 15, wherein the difference between the refractive index of the plurality of lenses and the refractive index of the lens planarization film is about 0.3 or greater.

17. A display device comprising:
a display panel including a plurality of pixels, each pixel of the plurality of pixels including N sub-pixels, where N is an integer of 2 or greater; and
a lens array on a surface of the display panel, the lens array including a plurality of lenses,
wherein:
each lens of the plurality of lenses overlaps with M sub-pixels, where M is an integer greater than N,
each pixel of the plurality of pixels includes a first sub-pixel configured to display a first color, a second sub-pixel configured to display a second color, and a third sub-pixel configured to display a third color,
the lens array includes a first lens, a second lens, a third lens, and a fourth lens, a plurality of second sub-pixels are at edges of the first and third lenses, and a plurality of first sub-pixels and a plurality of third sub-pixels are at edges of the second and fourth lenses.

18. The display device of claim 17, wherein:

the edges of the first and third lenses overlap with the plurality of second sub-pixels, and the edges of the second and fourth lenses overlap with the plurality of first sub-pixels and the plurality of third sub-pixels.

19. The display device of claim 17, wherein a part of one second sub-pixel of the plurality of second sub-pixels at the edge of the first lens does not overlap with the edge of the first lens.

20. The display device of claim 17, wherein:

a part of one first sub-pixel of the plurality of first sub-pixels at the edge of the second lens does not overlap with the edge of the second lens, and a part of one third sub-pixel of the plurality of third sub-pixels at the edge of the second lens does not overlap with the edge of the second lens.

\* \* \* \* \*